US011336279B2

(12) United States Patent
Udrea et al.

(10) Patent No.: US 11,336,279 B2
(45) Date of Patent: May 17, 2022

(54) POWER SEMICONDUCTOR DEVICE WITH A SERIES CONNECTION OF TWO DEVICES

(71) Applicant: Cambridge Enterprise Limited, Cambridge (GB)

(72) Inventors: Florin Udrea, Cambridge (GB); Loizos Efthymiou, Cambridge (GB); Giorgia Longobardi, Cambridge (GB); Martin Arnold, Cambridge (GB)

(73) Assignee: Cambridge Enterprise Limited, Cambridge (GB)

( * ) Notice: Subject to any disclaimer, the term of this patent is extended or adjusted under 35 U.S.C. 154(b) by 0 days.

(21) Appl. No.: 16/879,650

(22) Filed: May 20, 2020

(65) Prior Publication Data

US 2020/0287536 A1 Sep. 10, 2020

Related U.S. Application Data

(63) Continuation-in-part of application No. 16/630,321, filed as application No. PCT/GB2018/051999 on Jul.
(Continued)

(30) Foreign Application Priority Data

Jul. 14, 2017 (GB) .................................... 1711361

(51) Int. Cl.
*H03K 17/687* (2006.01)
*H01L 27/085* (2006.01)
(Continued)

(52) U.S. Cl.
CPC ..... *H03K 17/6871* (2013.01); *H01L 21/8252* (2013.01); *H01L 27/085* (2013.01);
(Continued)

(58) Field of Classification Search
CPC ....... H03K 17/6871; H03K 2017/6878; H03K 17/163; H03K 17/102; H03K 2217/0036;
(Continued)

(56) References Cited

U.S. PATENT DOCUMENTS 5,939,941 A 8/1999 Nair et al.
8,017,978 B2 9/2011 Lidow et al.
(Continued)

FOREIGN PATENT DOCUMENTS

EP 2390919 A2 11/2011
EP 2597767 A2 5/2013
(Continued)

OTHER PUBLICATIONS

International Search Report and Written Opinion from Corresponding International Application No. PCT/EP2020/062710, dated Aug. 24, 2020, 22 pages.
(Continued)

*Primary Examiner* — Ahmed N Sefer
(74) *Attorney, Agent, or Firm* — Tucker Ellis LLP

(57) ABSTRACT

A device includes a heterojunction device, a unipolar power transistor operatively connected in series with said hetero junction device; an external control terminal for driving said unipolar power transistor and said heterojunction device; and an interface unit having a plurality of interface terminals. A first interface terminal is operatively connected to an active gate region of the heterojunction device and a second interface terminal is operatively connected to said external control terminal. The heterojunction device includes a threshold voltage less than a threshold voltage of the unipolar power transistor, wherein the threshold voltage of the heterojunction device is less than a blocking voltage of the unipolar power transistor.

20 Claims, 13 Drawing Sheets

Related U.S. Application Data 13, 2018, now Pat. No. 11,217,687, application No. 16/879,650, which is a continuation-in-part of application No. 16/405,619, filed on May 7, 2019, which is a continuation-in-part of application No. PCT/GB2018/051999, filed on Jul. 13, 2018.

(51) Int. Cl.
| | |
|---|---|
| *H01L 21/8252* | (2006.01) |
| *H01L 29/861* | (2006.01) |
| H01L 27/06 | (2006.01) |
| H01L 29/20 | (2006.01) |
| H01L 49/02 | (2006.01) |
| H01L 29/417 | (2006.01) |
| H01L 29/778 | (2006.01) |
| H01L 29/872 | (2006.01) |
| H01L 29/205 | (2006.01) |
| H01L 29/10 | (2006.01) |
| H01L 27/088 | (2006.01) |

(52) U.S. Cl.
CPC ........ *H01L 29/861* (2013.01); *H01L 27/0605* (2013.01); *H01L 27/0629* (2013.01); *H01L 27/0883* (2013.01); *H01L 28/20* (2013.01); *H01L 29/1066* (2013.01); *H01L 29/2003* (2013.01); *H01L 29/205* (2013.01); *H01L 29/41758* (2013.01); *H01L 29/7786* (2013.01); *H01L 29/8611* (2013.01); *H01L 29/872* (2013.01)

(58) Field of Classification Search
CPC ............. H01L 27/0605; H01L 27/0629; H01L 29/2003; H01L 28/20; H01L 29/41758; H01L 29/7786; H01L 29/8611; H01L 29/872; H01L 29/205; H01L 29/0642; H01L 21/8252; H01L 27/0883; H01L 27/085; H01L 29/1066; H01L 29/861
See application file for complete search history.

(56) References Cited

U.S. PATENT DOCUMENTS

| | | | |
|---|---|---|---|
| 8,470,652 B1 | 6/2013 | Brown et al. | |
| 9,882,553 B2 | 1/2018 | Kwan et al. | |
| 10,170,973 B1* | 1/2019 | Hirose | H02M 7/217 |
| 10,374,591 B2 | 8/2019 | Ramabhadran et al. | |
| 10,411,681 B2 | 9/2019 | Kwan et al. | |
| 2002/0113274 A1 | 8/2002 | Iwagami | |
| 2007/0247211 A1 | 10/2007 | Brindle | |
| 2009/0065810 A1 | 3/2009 | Honea | |
| 2010/0258843 A1 | 10/2010 | Lidow | |
| 2011/0193171 A1 | 8/2011 | Yamagiwa et al. | |
| 2011/0210377 A1 | 9/2011 | Haeberlen | |
| 2011/0248283 A1 | 10/2011 | Cao | |
| 2011/0309372 A1 | 12/2011 | Xin et al. | |
| 2012/0228625 A1 | 9/2012 | Ikeda | |
| 2012/0306545 A1* | 12/2012 | Machida | H02M 1/08 |
| | | | 327/109 |
| 2013/0009165 A1* | 1/2013 | Park | H01L 27/0629 |
| | | | 257/76 |
| 2013/0099247 A1 | 4/2013 | Palacios et al. | |
| 2013/0181215 A1 | 7/2013 | Adekore | |
| 2013/0249622 A1* | 9/2013 | Honea | H03K 17/162 |
| | | | 327/424 |
| 2014/0001557 A1 | 1/2014 | Mishra | |
| 2014/0015066 A1 | 1/2014 | Wu | |
| 2014/0048850 A1 | 2/2014 | Jeon | |
| 2014/0049296 A1* | 2/2014 | Jeon | H03K 3/012 |
| | | | 327/109 |
| 2014/0061647 A1 | 3/2014 | Wender | |
| 2014/0084966 A1* | 3/2014 | Takemae | H03K 17/6877 |
| | | | 327/109 |
| 2014/0103969 A1* | 4/2014 | Jeon | H01L 29/7786 |
| | | | 327/109 |
| 2014/0138701 A1 | 5/2014 | Huang et al. | |
| 2014/0159119 A1 | 6/2014 | Derluyn | |
| 2014/0327043 A1* | 11/2014 | Kim | H01L 29/66462 |
| | | | 257/190 |
| 2015/0108547 A1 | 4/2015 | Hwang | |
| 2015/0171750 A1* | 6/2015 | Zeng | H01L 27/0605 |
| | | | 323/311 |
| 2015/0243775 A1 | 8/2015 | Haeberlen et al. | |
| 2015/0357321 A1 | 12/2015 | Ikeda | |
| 2016/0172284 A1* | 6/2016 | Cho | H01L 23/3107 |
| | | | 257/76 |
| 2016/0322466 A1 | 11/2016 | Simin | |
| 2016/0373106 A1 | 12/2016 | Shah et al. | |
| 2017/0025405 A1 | 1/2017 | Jeon et al. | |
| 2017/0110448 A1 | 4/2017 | Prechtl | |
| 2017/0148912 A1 | 5/2017 | Chu | |
| 2017/0194477 A1 | 7/2017 | Lin et al. | |
| 2017/0345920 A1 | 11/2017 | Nagahisa | |
| 2018/0145684 A1* | 5/2018 | Chang | H03K 17/102 |
| 2018/0182878 A1 | 6/2018 | Morvan | |
| 2018/0374943 A1* | 12/2018 | Liu | H03F 1/3205 |
| 2019/0312137 A1 | 10/2019 | Shibib et al. | |
| 2020/0007119 A1 | 1/2020 | Li et al. | |
| 2021/0226621 A1* | 7/2021 | Chuang | H03K 3/012 |

FOREIGN PATENT DOCUMENTS

| | | |
|---|---|---|
| KR | 1020160083256 A | 7/2016 |
| WO | 2012055570 A1 | 5/2012 |
| WO | 2019012293 A1 | 1/2019 |

OTHER PUBLICATIONS

O. Ambacher et al., "Two-dimensional electron gases induced by spontaneous and piezoelectric polarization charges in N- and Ga-face AlGaN/GaN heterostructures", Journal of Applied Physics 85, 3222, 1999, http:dx.doi.org/10.1063/1.369664, 13 pages.

Bin Lu et al., "High-Performance Integrated Dual-Gate AlGaN/GaN Enhancement-Mode Transistor", IEEE Electron Device Letters, vol. 31, No. 9, Sep. 2010, pp. 990-992, 3 pages.

L. Efthymiou et al., "On the physical operation and optimization of the p-GaN gate in normally-off GaN HEMT devices", Appl. Phys. Lett. 110, 123502, 2017, 6 pages.

Loizos Efthymiou et al., "On the Source of Oscillatory Behaviour during Switching of Power Enhancement Mode GaN HEMTs", Energies, 2017, 11 pages.

Peijie Feng et al., "Design of Enhancement Mode Single-gate and Doublegate Multi-channel GaN HEMT with Vertical Polarity Inversion Heterostructure", Proceedings of The 25th International Symposium on Power Semiconductor Devices & ICs, Kanazawa, 4 pages.

GaN Systems Inc., "GN001 Application Guide Design with GaN Enhancement mode HEMT", Feb. 28, 2018, 45 pages.

GaN Systems Inc., Bottom-side cooled 650 V E-mode GaN transistor Preliminary Datasheet, 2009-2017, 4 pages.

Injun Hwang et al., "1.6kV, 2.9 mΩ cm2 Normally-off p-GaN HEMT Device", Proceedings of the 2012 24th International Symposium on Power Semiconductor Devices and ICs Jun. 3-7, 2012—Bruges, Belgium, pp. 41-44, 15 pages.

Infineon, "MOSFET Metal Oxide Semiconductor Field Effect Transistor", CoolMOS C7, Apr. 29, 2013, 4 pages.

Man Ho Kwan et al., "CMOS-Compatible GaN-on-Si Field-Effect Transistors for High Voltage Power Applications", pp. 17.6.1-17.6. 4, 2014, 3 pages.

Finella Lee et al., "Impact of Gate Metal on the Performance of p-GaN/AlGaN/GaN High Electron Mobility Transistors", pp. 232-234, IEEE Electron Device Letters, vol. 36, No. 3, Mar. 2015, 3 pages.

Silvia Lenci et al., "Au-Free AlGaN/GaN Power Diode on 8-in Si Substrate With Gated Edge Termination", pp. 1035-1037, IEEE Electron Device Letters, vol. 34, No. 8, Aug. 2013.

(56) References Cited

OTHER PUBLICATIONS

Umesh K. Mishra et al., "GaN-Based RF Power Devices and Amplifiers", Proceedings of the IEEE, vol. 96, No. 2, Feb. 2008.

Tohru Oka et al., "AlGaN/GaN Recessed MIS-Gate HFET With High-Threshold-Voltage Normally-Off Operation for Power Electronics Applications", IEEE Electron Device Letters, vol. 29, No. 7, Jul. 2008.

Hideyuki Okita et al., "Through Recessed and Regrowth Gate Technology for Realizing Process Stability of GaN-GITs", Proceedings of the 2016 28th International Symposium on Power Semiconductor Devices and ICs (ISPSD), Jun. 12-16, 2016, Prague, Czech Republic.

Yasuhiro Uemoto et al., "Gate Injection Transistor (GIT)—A Normally-Off AlGaN/GaN Power Transistor Using Conductivity Modulation", IEEE Transactions On Electron Devices, vol. 54, No. 12, Dec. 2007.

Michael J. Uren et al., "Buffer Design to Minimize Current Collapse in GaN/AlGaN HFETs", IEEE Transactions On Electron Devices, vol. 59, No. 12, Dec. 2012.

Wataru Saito et al., "Recessed-Gate Structure Approach Toward Normally Off High-Voltage AlGaN/GaN HEMT for Power Electronics Applications", IEEE Transactions On Electron Devices, vol. 53, No. 2, Feb. 2006.

Yong Cai et al., "High-Performance Enhancement-Mode AlGaN/GaN HEMTs Using Fluoride-Based Plasma Treatment", IEEE Electron Device Letters, vol. 26, No. 7, Jul. 2005.

Tsai Jung-Ruey et al., "Engineered threshold voltage in AlGaN/GaN HEMTs for normally-off operation", 2015 International Symposiun On Next-Generation Electronics (ISNE), IEEE, May 4, 2015, pp. 1-2, XP032789065, DOI: 10.1109/ISNE.2015.7131989 section "Methodology"; figure 4, 2 pages.

Yu, Guohao, et al., "Dynamic Characterizations of AlGaN/GaN HEMTs with Field Plates Using a Double-Gate Structure", IEEE, vol. 34, No. 2, Feb. 2013, p. 217-219, 3 pages.

International Search Report and Written Opinion from correlating International Application No. PCT/GB2018/051999, dated Nov. 27, 2018, 19 pages.

Wael et al., "AlGan HEMT based digital circuits on 3C-SiC(111)/Si(111) pseudosubstrates" Phys. Status Solidi A 214, No. 4, 1600416 (2017), 6 pages.

* cited by examiner

POWER SEMICONDUCTOR DEVICE WITH A SERIES CONNECTION OF TWO DEVICES

RELATED APPLICATION DATA

This application is a continuation-in-part of U.S. patent application Ser. No. 16/630,321, filed Jan. 10, 2020, which is a U.S. National Phase Entry of PCT/GB2018/051999, filed Jul. 13, 2018, which claims the benefit of United Kingdom Patent Application No. 1711361.4, filed Jul. 14, 2017, the disclosures of which are incorporated herein by reference in their entireties. This application also is a continuation in part of U.S. patent application Ser. No. 16/405,619, filed May 7, 2019, which is a continuation in part of International Patent Application No. PCT/GB2018/051999, filed Jul. 13, 2018, which claims the benefit of United Kingdom Patent Application No. 1711361.4, filed Jul. 14, 2017, the disclosures of which are incorporated herein by reference in their entireties.

TECHNICAL FIELD

The present invention relates to a power semiconductor device, for example to a hetero-structure aluminium gallium nitride/gallium nitride (AlGaN/GaN) high electron mobility transistor (HEMT) or rectifier. The power semiconductor device includes a double gate structure.

BACKGROUND

A power semiconductor device is a semiconductor device used as a switch or rectifier in power electronics (e.g., dc to ac inverter for motor control or dc to dc converter for switched-mode power supplies). A power semiconductor device is usually used in "commutation mode" (i.e., it is either on or off), and therefore has a design optimized for such usage.

Silicon bipolar junction transistors (BJT), metal-oxide-semiconductor field effect transistors (MOSFET) and insulated gate bipolar transistors (IGBT) are common types of power semiconductor switching devices. Their application areas range from portable consumer electronics, domestic appliances, electric cars, motor control and power supplies to RF and microwave circuits and telecommunication systems.

Gallium Nitride (GaN) has increasingly been considered as a very promising material for use in the field of power devices with the potential to lead to increased power density, reduced on-resistance, and high frequency response. The wide band gap of the material ($E_g$=3.39 eV) results in high critical electric field ($E_c$=3.3 MV/cm) which can lead to the design of devices with a shorter drift region, and therefore lower on-state resistance, if compared to a silicon-based device with the same breakdown voltage [1]. The use of an AlGaN/GaN heterostructure also allows the formation of a two-dimensional electron gas (2DEG) at the hetero-interface where carriers can reach very high mobility ($\mu$=2000 cm$^2$/(Vs)) values [1]. In addition, the piezopolarization charge present at the AlGaN/GaN heterostructure, results in a high electron density in the 2DEG layer (e.g. 1×10$^{13}$ cm$^{-2}$). These properties allow the development of High Electron Mobility Transistors (HEMTs) and Schottky barrier diodes with very competitive performance parameters [2],[3]. An extensive amount of research has focused on the development of power devices using AlGaN/GaN heterostructures.

However, the 2DEG which inherently exists at the AlGaN/GaN hetero-interface creates a challenge when attempting the design of normally-off rather than normally-on devices. Nonetheless, as normally-off transistors are preferable in most power electronic applications several methods have been proposed which can lead to enhancement mode devices, among them the use of metal insulator semiconductor structures [4], use of fluorine treatment [5], recessed gate structures [6] and use of a p-type cap layer [7][8]. Due to the relative maturity and controllability in the epitaxial growth of pGaN layers compared to the other techniques, pGaN/AlGaN/GaN HEMTs are considered the leading structure for commercialization.

FIG. 1 shows schematically the cross section in the active area of a state of the art pGaN HEMT. The device shown is a lateral three-terminal device with an AlGaN/GaN heterostructure grown epitaxially on a standard silicon wafer 4. A transition layer 3 is used to allow a high quality GaN layer 2 to be grown despite the significant lattice mismatch between GaN and Si. Carbon p-type doping is often added in the GaN layer [9]. Finally, a thin cap GaN layer 11 is typically added to form the gate with a Magnesium (Mg) p-type doping density greater than 1×10$^{19}$ cm$^{-3}$. A TCAD model of the device shown in FIG. 1 has been developed for comparison with the proposed invention.

A typical pGaN gate device has a threshold voltage of ~1.5-2V and gate turn-on bias voltage of ~8V. Threshold voltage and gate turn-on voltage in enhancement mode GaN devices are of great interest as problems such as unwanted device turn-on when the device is supposed to be off may occur in operation if threshold voltage is low. Secondly, gate turn-on may be a problem due to the non-insulated gate structure.

In the state of the art device a trade-off exists between the threshold voltage of the device and the carrier density in the 2DEG of the device and consequently the device on-state resistance. A previous study has shown that for a pGaN doping greater than 1×10$^{19}$ cm$^{-3}$ the threshold voltage cannot be significantly altered by the use of a different gate metal or the thickness of the pGaN layer [10]. A narrow window of operation is therefore specified in these devices (with gate voltages in the range of 4V to 7V with respect to the source) [11] unlike their silicon counterparts [12]. The lower boundary is defined by the gate bias needed to fully form the channel (2DEG) below the gate (this is referred to as the threshold voltage, Vth), and the upper boundary is limited by the point at which the gate turns on and considerable current starts flowing through it.

Another area of interest in AlGaN/GaN HEMTs is their fast switching capability. The high mobility of carriers in the 2DEG and a shorter drift region for a given breakdown due to higher critical electric field can lead to very low drift region charge, Qgd. Furthermore, the device gate charge Qg is about an order of magnitude lower than corresponding state of the art silicon devices [11], [12]. Therefore, the GaN HEMTs can switch at much higher speeds than silicon MOSFETs. While this is beneficial in many applications, it can lead to unwanted oscillations due to parasitic components present both at the device and circuit level [13]. A possible solution proposed in order to avoid the oscillatory behaviour is to add an external gate resistance to the device in order to reduce the dV/dt and dI/dt rate observed [13].

In [14], an attempt to enlarge the window of operation defined by the threshold voltage and the opening of the pGaN/AlGaN junction has been made by varying the composition of the gate metal. This attempt resulted to be unsuccessful as discussed in [10] where it is showed that for a pGaN doping greater than 1×10$^{19}$ cm$^{-3}$ the threshold voltage cannot be significantly altered using a different gate metal or by altering the thickness of the pGaN layer.

In [16] a higher Vth on a P-gate technology has been obtained via 'Through Recessed and Regrowth Gate (TRRG)' technique. This process technology is based on a complete removal of the AlGaN barrier layer and subsequent regrowth of it by epitaxial regrowth. This demonstrates more stable threshold voltages at increasing temperatures and the possibility to reach Vth as high as 2.3V by controlling the thickness of the AlGaN layer. Although this is an interesting process technology to obtain a stable threshold voltage, it does affect the Ron when a Vth>2V is achieved. Moreover, the high Vth solution presented in [16] does not address the problem of the Rg-related oscillations during the fast switching of the high voltage transistor, nor the high gate leakage of the pGaN gate technology.

In [17] an integrated double-gate technology for achieving high Vth (>2.8V) is demonstrated. The double-gate technology suggested in [17] is based on the integration of a high voltage normally-on (D-Mode) and low voltage normally-off (E-Mode) GaN transistors. In this configuration however, the two transistors are in series and the overall on-state resistance will be therefore be affected by the series contribution of the on-state resistance of the low voltage device.

Other proposed double-gate technologies are present in literature and they are so called as they feature a second gate electrode either on top of the gate passivation layer [18] or buried into the heterostructures stack [19]. These devices mainly aim at improving the dynamic performance of the transistors by alleviating the current collapse phenomenon. The current collapse phenomenon is in fact a current reduction in the on-state, when the device is repeatedly stressed to high voltages in the off-state, An attempt to increase the Vth of a normally-off (enhancement mode—E-Mode) GaN transistor using a circuit configuration with diodes and a second gate electrode is made in [20]. In this document the diodes are used as voltage shifters and are connected in series with the gate of the high-voltage GaN devices. A device where the voltage shifter is achieved with a transistor is also described. In this particular case, however, the drain terminal of the voltage-shifter-transistor is connected with the high-voltage drain terminal of the GaN device. The implication of such connection is that the driving device will have to sustain the high voltage in blocking mode and therefore be designed as a high voltage transistor with a longer drift region than for a low-voltage device. The device will therefore have increased area consumption and reliability of this additional transistor has to be taken into account. In addition in [20] no mention is made of the upper boundary limitation.

The series combination of a low power silicon MOSFET with a wide bandgap semiconductor is known. Dohnke at al, (U.S. Pat. No. 6,373,318) disclose a low voltage silicon MOSFET in a Cascode (series) configuration with a wide bandgap material device. The gate of the wide bandgap material device is connected to the source of the low voltage Silicon MOSFET. The wide bandgap device is assumed to be normally-on.

Lidow et al (U.S. Pat. No. 8,017,978 B2) disclose a series combination of a Si low voltage MOSFET with a GaN HEMT where the GaN HEMT and the low voltage MOSFET receive simultaneously a gate signal. There is no specification of the type of the GaN HEMT. While this combination allows for both normally on and normally off transistors, the prior art GaN HEMTs have a lower threshold voltage and lower operating voltage range than those of the low voltage silicon MOSFET, making the simultaneous drive very challenging.

SUMMARY

According to one aspect of the invention there is provided a device comprising:
- a heterojunction device having a first heterojunction terminal, a second heterojunction terminal and a heterojunction gate terminal connected to an active gate region;
- a unipolar power transistor operatively connected in series with said hetero junction device;
- an interface unit comprising at least a first interface terminal and a second interface terminal, wherein the first interface terminal is operatively connected to the heterojunction gate terminal and
- wherein said heterojunction device has a threshold voltage less than a threshold voltage of said unipolar power transistor, wherein the threshold voltage of the heterojunction device is less than a blocking voltage of said unipolar power transistor.

In some embodiments, the power MOSFET may be a silicon based power MOSFET. Additionally or alternatively, the power MOSFET may be a low voltage MOSFET.

In some embodiments the silicon MOSFET comprises a first silicon terminal, a second silicon terminal and a third silicon gate terminal, and wherein the second silicon terminal is operatively connected to the first heterojunction terminal and wherein the silicon gate terminal is operatively connected to the second interface terminal.

In other embodiments a gate driver used for driving said unipolar power transistor and said heterojunction device is operatively connected to the second interface terminal or to a slew rate control unit.

In further embodiments, an absolute value of the threshold voltage of the heterojunction device is less than a blocking voltage of said power MOSFET. It will be appreciated that a blocking voltage or a breakdown voltage of a MOSFET is the maximum voltage that may be applied to a MOSFET. It will also be appreciated that an absolute value of a voltage is the magnitude of the voltage (i.e. without regard for its sign). For example, the absolute value of −3V is 3V.

We also describe herein a wide bandgap heterojunction device (i.e. HEMT) which is either a normally-on or a device with a threshold voltage close to or approximately or almost zero volts (which could be depending on the operating conditions either normally on or normally off) in series with a low voltage Silicon MOSFET and whereby the said heterojunction device features an interface attached to its heterojunction gate terminal to either increase its threshold voltage (when the threshold voltage relates to the potential applied to the second interface terminal (could be an external control terminal) and/or increase the operating range (when the operating range relates to the potential applied to the second interface terminal (could be an external control terminal) so that the control signal applied can be used to drive both the heterojunction device (HEMT) and the unipolar power transistor (power MOSFET).

It will be appreciated that the term "close to" zero may mean that the threshold voltage may be a value between −0.5V and 1V.

One role of the interface unit is to provide a wider range for the acceptable control signal applied by the gate driver by limiting the maximum voltage signal level that may be applied to the active gate terminal. Additionally, the interface unit may change (for example increase) the threshold of the second interface terminal (could be external control signal) at which the on-state channel in the GaN HEMT is formed.

The heterojunction device described in any of the embodiments above may be connected in series with a low voltage power (e.g. blocking voltage rating of 5V-50V) Si MOSFET where the source terminal of the heterojunction device is connected to the drain terminal of the Si MOSFET. The threshold voltage of the heterojunction device (pGaN HEMT) is lower than the threshold voltage of the Si MOSFET. Additionally, the maximum allowable gate voltage of the heterojunction device (pGaN HEMT) is lower than the maximum allowable gate voltage of the Si MOSFET. The interface attached to the heterojunction device as described in the examples above would allow driving from the same gate driver used to drive the Si MOSFET. The additional interface could be integrated monolithically with the heterojunction device (i.e. pGaN HEMT). Further examples of such an additional interface circuitry is described in the PCT publication WO/2019/012293A1 and the USPTO publication US/2019/0267482A1, which are incorporated herein by reference. The above arrangement could be co-packaged or be configured with discrete components. In this arrangement the absolute value of the threshold voltage of the heterojunction device is intended to be smaller than the blocking voltage rating of the power MOSFET.

In another embodiment, the co-driven heterojunction device and MOSFET device described can include a slew rate control block in the gate driving path of the heterojunction device.

In an additional embodiment the gate terminal of the high voltage HEMT (i.e. the active gate region) may be designed differently compared to the design in prior art. In prior art devices, the highly doped semiconductor layer (pGaN layer) under the gate terminal has a constant length. The length parameter in this description is defined along the direction of the current flow between the first heterojunction terminal (for example, a source terminal) and the second heterojunction terminal (for example, a drain terminal). In this invention, the pGaN gate layer can be composed of regions of different lengths. Such a device would include at least two regions of highly doped semiconductor regions (e.g. pGaN) of a standard gate length which are connected to at least two additional regions of highly doped semiconductor (e.g. pGaN) with a narrower length. Standard gate length is defined as a sufficient length to ensure blocking and avoid excessive punch through leakage or breakdown during the operation of the device in the off-state. The additional regions described may be narrower (i.e. shorter in length) than the at least two highly doped semiconductor regions. The additional regions may be manufactured in the same process step. The additional regions may not be connected to the active gate terminal directly but may be connected through first contacting the at least two highly doped semiconductor regions.

The narrower regions of highly doped semiconductor can lead to a device with reduced specific on-state resistance (compared to a device with a continuous region of highly doped semiconductor in prior art) by reducing the resistance of the channel directly underneath the additional regions. This may lead to a reduction of the threshold voltage of the device compared to the device with a continuous region of highly doped semiconductor in prior art but may have an increased threshold voltage (that is less negative or even positive) compared to a depletion mode (normally on) HEMT in prior art.

To ensure good off-state operation and that off-state leakage current remains within acceptable limits the device described in this embodiment may need to be driven to a negative gate bias voltage (even if the threshold is nominally positive) to avoid punch through and/or excessive off-state leakage occurring. The device described in this embodiment may become a normally-on device if an increased polarization charge exists at the AlGaN/GaN interface (leading to a 2DEG with an increased carrier density). This for example may be achieved through the use of a thicker AlGaN barrier layer or an increased Aluminium mole fraction.

Magnesium could be used for the p GaN layer.

In another embodiment, the heterojunction device or co-driven heterojunction and MOSFET device described in previous embodiments, is placed in a half bridge configuration, and the gates of the two transistors (both high and low side) are connected to gate driving blocks which are in turn connected to logic blocks. These connections can be made with discrete or monolithically integrated components.

In some embodiments, there is also provided a method for operating the device described hereinbefore, the method comprising driving said heterojunction device and said unipolar power transistor using the gate driver.

BRIEF DESCRIPTION OF THE PREFERRED EMBODIMENTS

The present disclosure will be understood more fully from the detailed description that follows and from the accompanying drawings, which however, should not be taken to limit the invention to the specific embodiments shown, but are for explanation and understanding only.

DETAILED DESCRIPTION OF THE PREFERRED EMBODIMENTS

Figure 1:
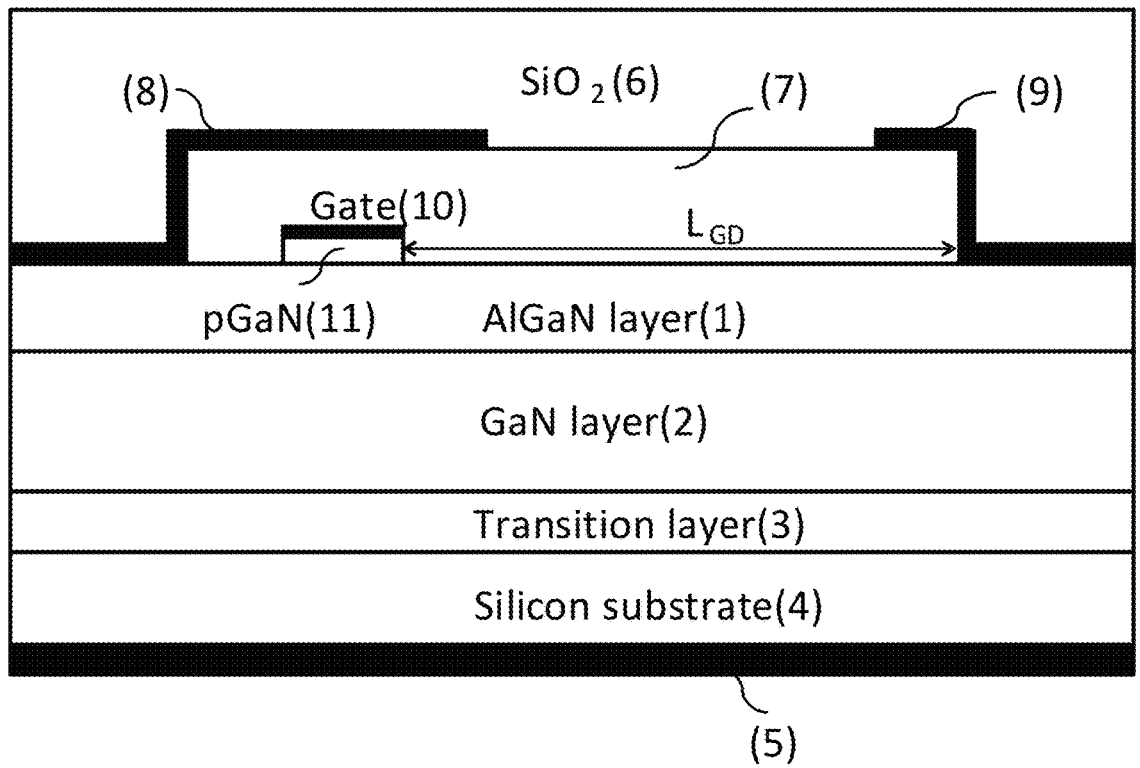
FIG. 1 shows schematically the cross section in the active area of a state of the art pGaN HEMT.

Described herein is a specific solution for a p-gate GaN E-Mode transistors for (i) reducing the gate leakage current thus increasing the gate voltage operation window, (ii) limiting the oscillation during the switching of the configuration, (iii) improving the switching performance of the overall configuration via appositely designed and integrated pull-down networks.

This may take the form of a GaN power device that has the ability of a high threshold voltage, a significantly large gate voltage operation range with less or no risk of p-GaN junction opening, and oscillation-free or oscillation-reduced switching behaviour. The details of this invention will be discussed considering but not limited to a pGaN gate E-Mode technology.

Broadly speaking, an aspect of invention relates to power semiconductor devices in GaN technology. The invention proposes an integrated auxiliary (double) gate terminal and a pulldown network to achieve a normally-off (E-Mode) GaN transistor with threshold voltage higher than 2V, low gate leakage current and enhanced switching performance. The high threshold voltage GaN transistor has a high-voltage active GaN device and a low-voltage auxiliary GaN device wherein the high-voltage GaN device has the gate connected to the source of the integrated auxiliary low-voltage GaN transistor and the drain being the external high-voltage drain terminal and the source being the external source terminal, while the low-voltage auxiliary GaN transistor has the gate (first auxiliary electrode) connected to the drain (second auxiliary electrode) functioning as an external gate terminal. In other embodiments a pull-down network for the switching-off of the high threshold voltage GaN transistor is formed by a diode, a resistor, or a parallel connection of both connected in parallel with the low-voltage auxiliary GaN transistor.

In one embodiment, a III-nitride semiconductor based heterojunction device may comprise a substrate, an active heterojunction transistor formed on the substrate and an auxiliary heterojunction transistor formed on the substrate.

The active heterojunction transistor may further comprise a first III-nitride semiconductor region comprising a first heterojunction comprising an active two dimensional carrier gas, a first terminal operatively connected to the III-nitride semiconductor region, a second terminal laterally spaced from the first terminal and operatively connected to the III-nitride semiconductor region, and an active gate region formed over the III-nitride semiconductor region, the active gate region being formed between the first terminal and the second terminal.

The auxiliary heterojunction transistor may comprise a second III-nitride semiconductor region comprising a second heterojunction comprising an auxiliary two dimensional carrier gas, a first additional terminal operatively connected to the second III-nitride semiconductor region, a second additional terminal laterally spaced from the first additional terminal and operatively connected to the second III-nitride semiconductor region, and an auxiliary gate region formed over the second III-nitride semiconductor region, the auxiliary gate region being formed between the first additional terminal and the second additional terminal.

The first additional terminal may be operatively connected with the auxiliary gate region, and wherein the second additional terminal is operatively connected with the active gate region.

Here the term "operatively connected" means the terminals are electrically connected. In other words, the first additional terminal and the auxiliary gate are electrically connected, and the second additional terminal and the active gate region are electrically connected. Furthermore, in one embodiment, the first terminal is a source terminal of the active transistor, and the second terminal is a drain terminal of the active transistor. On the other hand, the first additional terminal is a drain terminal of the auxiliary transistor and the second additional terminal is a source terminal of the auxiliary transistor. In embodiments, the connected first additional terminal and the auxiliary gate region form a high voltage terminal (or form an external gate terminal—second interface terminal) in which a relatively higher voltage is applied compared to the second additional terminal. Therefore, the second additional terminal can be termed as a low voltage terminal of the auxiliary transistor. Here the term "III-nitride semiconductor region" generally refers to an entire region comprising a GaN layer and an AlGaN layer formed on the GaN layer. The two dimensional carrier gas is generally formed at the interface between the GaN layer and the AlGaN layer within the III-nitride semiconductor region. In embodiments, the two dimensional carrier gas refers to two dimensional electron gas (2DEG) or two dimensional hole gas (2DHG).

The heterojunction device may further comprise an isolator region between the active heterojunction transistor and the auxiliary heterojunction transistor. The isolator region separates the active two dimensional carrier gas and the auxiliary two dimensional carrier gas. Isolator region may separate the first and second III-nitride semiconductor regions.

In use, when the first additional terminal and the auxiliary gate region may be biased at a potential (or a voltage), a carrier density in a portion of the auxiliary two dimensional carrier gas underneath the auxiliary gate region is controlled such that an auxiliary two dimensional carrier gas connection is established between the first and second additional terminals. Generally, there is a two dimensional electron gas (2DEG) formed underneath the first and second additional terminals. When a voltage is applied to the auxiliary gate region (or the high voltage terminal), it controls the carrier density in the 2DEG underneath the auxiliary gate so that a 2DEG connection is formed between the 2DEG underneath the first and second additional terminals.

The active gate region may be configured to be switched on through the auxiliary two dimensional carrier gas (e.g. 2DEG) connection between the first and second additional terminals. The resistance variation from the 2DEG connection underneath the auxiliary gate region enables to turn on the active gate as well. The auxiliary 2DEG connection may serve as an internal resistance to the active gate region.

The first additional terminal and the auxiliary gate region may be configured such that a part of the potential is used to form the auxiliary 2DEG connection and a further part of potential is used to switch on the active gate region.

The first III-nitride semiconductor region may comprise an active aluminium gallium nitride (AlGaN) layer directly in contact with the first terminal, the active gate region and the second terminal.

The second III-nitride semiconductor region may comprise an auxiliary aluminium gallium nitride (AlGaN) layer directly in contact with the first additional terminal, the auxiliary gate region and the second additional terminal.

The thickness of the active AlGaN layer and the auxiliary AlGaN layer may be the same or different.

The doping concentration of the active AlGaN layer and the auxiliary AlGaN layer may be the same or different.

The aluminium mole fraction of the active AlGaN layer and the auxiliary AlGaN layer may be the same or different.

The active gate region may comprise a p-type gallium nitride (pGaN) material. The metal contact on the active pGaN gate could be Schottky or ohmic. Alternatively, the active gate region may comprise a recessed Schottky contact.

The auxiliary gate region may comprise a p-type gallium nitride (pGaN) material. The metal contact on the auxiliary pGaN gate could be Schottky or ohmic. Alternatively, the auxiliary gate region may comprise a recessed Schottky contact. It will be appreciated that, in embodiments, the active gate region may have the pGaN material and the auxiliary gate region may have the recessed Schottky gate. It is also possible that the active gate region may have the Schottky gate and the auxiliary gate region may have the pGaN material.

The first terminal, the second terminal, the first additional terminal and the second additional terminal may each comprise a surface ohmic contact. Alternatively, the first terminal, the second terminal, the first additional terminal and the second additional terminal may each comprise a recessed ohmic contact.

The auxiliary gate region may comprise a field plate extending towards the first additional terminal and wherein the field plate extends over a field oxide region.

The device may have an interdigitated layout in which a gate metal pad is directly connected with the auxiliary gate region and the first additional terminal, and the active gate region comprises gate fingers connected with the second additional terminal. Alternatively, the device may have an interdigitated layout in which the auxiliary gate region, the first additional terminal and the second additional terminal are placed below a source metal pad. Advantageously, no additional wafer area would be needed to include the auxiliary gate structure compared to a state of the art design.

In embodiments, the second additional terminal and the active gate region may be connected in a third dimension of the device.

The heterojunction device may further comprise an additional auxiliary heterojunction transistor according to the arrangement of the auxiliary heterojunction transistor as described above. The heterojunction device may comprise a further isolator region between the auxiliary heterojunction transistor and the additional auxiliary heterojunction transistor. It will be appreciated that more additional auxiliary heterojunction transistors can be added.

The active heterojunction transistor may be a high voltage transistor and the auxiliary heterojunction transistor may be a low voltage transistor compared to the active heterojunction transistor.

The heterojunction device may further comprise a diode connected in parallel between the first and second additional terminals of the auxiliary heterojunction transistor. The parallel diode acts as a pull-down network during the turn-off of the overall configuration connecting to ground from the gate terminal of the active GaN transistor. When a positive bias (on-state) is applied to the auxiliary gate, the diode will be reverse-biased and zero current will flow through it, leaving unaffected the electrical behaviour of the overall high-voltage configuration. When a zero bias (off-state) will be applied to the auxiliary gate the diode will forward bias and the turn-off current flowing through it will discharge the gate capacitance of the active transistor, thus enabling the switching off of the overall configuration. In off-state, the gate of the active transistor will remain biased to a minimum voltage equal to the turn-on voltage of the diode. The diode will therefore be designed in such a way that its turn-on voltage will be as low as possible, ideally few mV. The diode may be formed monolithically with the device. The diode could be a simple Schottky diode. The diode generally pulls down the active gate during turn-off to the diode $V_{th}$, therefore the diode needs to be designed to have as low a threshold voltage as possible. A feature which can achieve this is the use of a recessed anode such that the contact is made directly to the 2DEG.

The heterojunction device may further comprise a resistor connected in parallel between the first and second additional terminals of the auxiliary heterojunction transistor. The resistor is generally a relatively high value resistor connected in parallel between the first and second additional terminals of the low-voltage transistor (or the auxiliary transistor). The parallel resistor acts as a pull-down network during the turn-off of the overall configuration connecting to ground the gate terminal of the active GaN transistor. As a consequence, zero voltage will be applied to the gate of the active device when zero current is flowing into the resistor. The resistor will need to be chosen or designed as a relatively high value resistor. In this way, the resistor is less effective during on-state and turn-on as it is in parallel with the significantly smaller resistance of the auxiliary 2DEG. This resistor should generally be designed to play a role only during turn-off and off-state when the auxiliary transistor has a very large equivalent resistance. The resistor can be formed monolithically. For example this can be done by removing sections of the auxiliary gate/pGaN such that the 2DEG beneath those sections is always present and can act as a resistance which can pull down the active gate voltage during turn-off. The resistor could also be adjusted to be generally large during turn-on/on-state to see the benefits of the auxiliary gate on the device characteristics, nevertheless generally small, when compared to the equivalent resistance of the auxiliary transistor during turn-off to allow a fast turn-off. Generally speaking the relatively high value resistance could be at least about 500 ohm.

The heterojunction device may further comprise a diode and a resistor each connected in parallel between the first and second additional terminals of the auxiliary heterojunction transistor. The diode is a low on-state voltage diode and the resistor is a high resistor connected in parallel between the drain and the source (gate) of the low-voltage transistor. The parallel connection of the diode and resistor will act as a pull-down network during the turn-off of the overall configuration. These components could be included in the design monolithically.

We also describe a method of manufacturing the III-nitride semiconductor based heterojunction device described above. The method may comprise forming the active heterojunction transistor on the substrate, and forming an auxiliary heterojunction transistor on the substrate. The method may further comprise operatively connecting the first additional terminal with the auxiliary gate region, and operatively connecting the second additional terminal with the active gate region.

Additionally, an isolator region may be formed between the active heterojunction transistor and auxiliary heterojunction transistor separating the active two dimensional carrier gas and the auxiliary two dimensional carrier gas.

The method may further comprise forming the first III-nitride semiconductor region at the same time as forming the second III-nitride semiconductor region and/or forming the active gate region at the same time as forming the auxiliary gate region.

The method may further comprise forming a metallization layer for the first terminal, the second terminal, the first additional terminal, and the second additional terminal at the same time.

Figure 2:
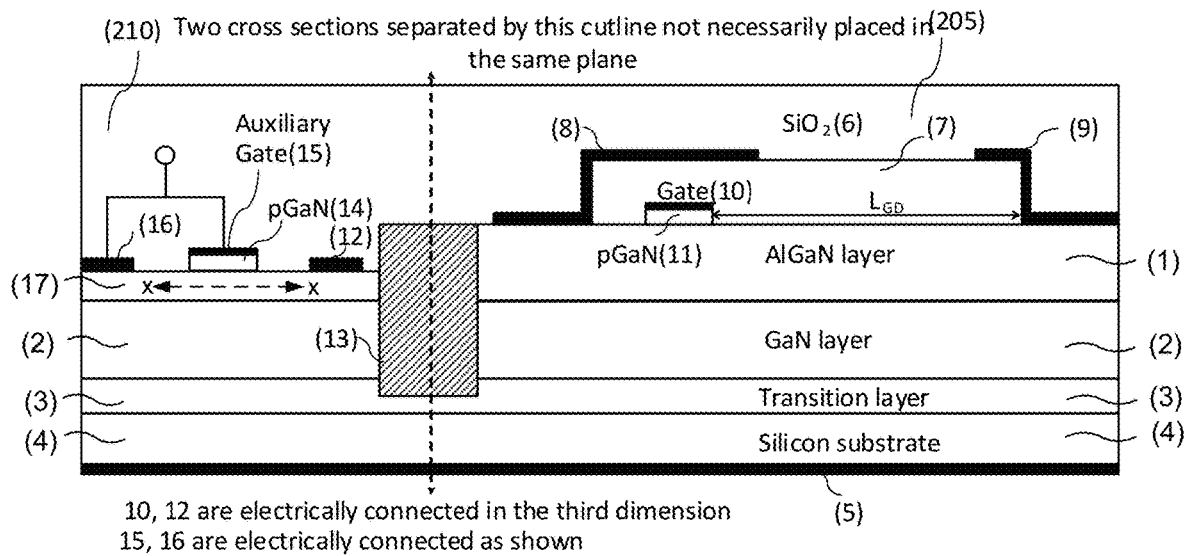
FIG. 2 illustrates a schematic representation of a cross section of the active area of the proposed invention, according to one embodiment of the invention.

FIG. 2 illustrates a schematic representation of a cross section of the active area of the proposed invention, according to one embodiment of the invention. In use the current flows in the active area of the semiconductor device. In this embodiment, the device comprises a semiconductor (e.g. silicon) substrate 4 defining a major (horizontal) surface at the bottom of the device. Below the substrate 4 there is a substrate terminal 5. The device includes a first region of a transition layer 3 on top of the semiconductor substrate 4. The transition layer 3 comprises a combination of III-V semiconductor materials acting as an intermediate step to allow the subsequent growth of regions of high quality III-V semiconductor materials.

On top of the transition layer 3 there exists a second region 2. This second region 2 is of high quality III-V semiconductor (for example GaN) and comprises several layers. A third region 1 of III-V semiconductor containing a mole fraction of Aluminium is formed on top of the second region 2. The third region 1 is formed such that a hetero-structure is formed at the interface between the second 2 and third region 1 resulting in the formation of a two dimensional electron gas (2DEG).

A fourth region of highly p-doped III-V semiconductor 11 is formed in contact with the third region 1. This has the function of reducing the 2DEG carrier concentration when the device is unbiased, and is pGaN material in this embodiment. A gate control terminal 10 is configured over the fourth region 11 in order to control the carrier density of the 2DEG at the interface of the second 2 and third region 1. A high voltage drain terminal 9 is arranged in physical contact with the third region 1. The high voltage drain terminal forms an ohmic contact to the 2DEG. A low voltage source terminal 8 is also arranged in physical contact with the third region 1 and also forms an ohmic contact to the 2DEG.

A portion of surface passivation dielectric 7 is formed on top of the fourth region 1 and between the drain terminal 9 and source terminal 8. A layer of $SiO_2$ passivation 6 is formed above the surface passivation dielectric 7 and source and drain terminals 8, 9.

The device is separated into two cross sections by a vertical cutline. The two cross sections may not be necessarily placed in the same plane. The features described above are on one side (right hand side, for example) of the vertical cutline. This is termed as the active device 205. The other side of the vertical cutline (the left hand side, for example) is termed as the auxiliary device 210, which also comprises a semiconductor substrate 4, a transition layer 3, a second region 2 and a $SiO_2$ passivation region 6.

A fifth region of III-V semiconductor 17 containing a mole fraction of Aluminium is positioned above the second region 2 in the auxiliary device such that a hetero-structure is formed at the interface between this fifth region 17 and the second region 2. This results in the formation of a second two dimensional electron gas (2DEG) in a region which will be referred to as the auxiliary gate. This AlGaN layer 17 of the auxiliary device 210 can be identical or different to the AlGaN layer 1 in the active device 205. The AlGaN layer thickness and Al mole fraction are critical parameters as they affect the carrier density of electrons in the 2DEG [15].

A sixth region of highly p-doped III-V semiconductor 14 is formed on top of and in contact with the fifth region 17. This has the function of reducing the 2DEG carrier concentration when the auxiliary gate is unbiased. An auxiliary gate control terminal 15 is configured over the sixth region 14 in order to control the carrier density of the 2DEG at the interface of the fifth 17 and second region 2. The auxiliary gate pGaN layer 14 may be identical or different to the active gate pGaN layer 11. Critical parameters which could differ include, but are not limited to, pGaN doping and width along the x-axis (shown in the figure).

An isolation region 13 is formed down the vertical cutline. This cuts the electrical connection between the 2DEG formed in the active device 205 and the 2DEG formed in the auxiliary device 210.

A first additional terminal 16 is arranged on top of and in physical contact with the fifth region 17 of the auxiliary device 210. This forms an ohmic contact to the 2DEG of the auxiliary device 210 and is also electrically connected (via interconnection metal) to the auxiliary gate control terminal 15 configured over the sixth region (pGaN) 14. The first additional terminal 16 is biased at the same potential as the auxiliary gate terminal 15 of the auxiliary device. A second additional terminal 12 is also arranged on top of and in physical contact with the fifth region 17 of the auxiliary device 210. This forms an ohmic contact to the 2DEG of the auxiliary device 210 and is electrically connected (via interconnection metal) to the active gate control terminal 10 configured over the fourth region 11 of the active device 205. The interconnection between the second additional terminal 12 of the auxiliary device 210 and the active gate terminal 10 of the active device 205 can be made in the third dimension and can use different metal layers in the process.

Note that this interconnection is not shown in the schematic in FIG. 2. A similar but not necessarily identical AlGaN/GaN structure is used in the auxiliary gate.

When the device is in use the auxiliary gate 14, 15 drives the active gate 10, 11. The auxiliary 2DEG layer formed between the first and second additional terminals 12, 16 with the portion under the auxiliary p-GaN gate 14 is controlled by the potential applied to the auxiliary gate terminal 15.

The portion of the auxiliary 2DEG under the auxiliary pGaN gate 14 is depleted when the auxiliary gate terminal 15 and the short-circuited first additional terminal 16 are at 0V. As the auxiliary gate bias is increased (both terminals 15, 16) the 2DEG starts forming under the pGaN gate 14 connecting to the already formed 2DEG layer which connects to the first and second additional terminals 16, 12. A 2DEG connection is now in place between the first and second additional terminals 12, 16.

As the second additional terminal 12 is connected to the active gate 10 the device can now turn on. A positive (and desirable) shift in the device threshold voltage is observed using this structure as not all of the potential applied to the auxiliary gate 15 is transferred to the active gate 10. Part of this potential is used to form the auxiliary 2DEG under the auxiliary gate 15 and only part is transferred to the second additional terminal 12 which is connected to the active gate 10.

The auxiliary gate provides the additional advantage of being able to control the gate resistance of the device more easily. This can be achieved by varying the field plate design or distance between terminals 12 and 15 or 15 and 16. This can be useful in controlling the unwanted oscillations observed due to the fast switching of these devices.

Different embodiments of the device can include terminals 10, 15 being either Schottky or Ohmic contacts or any combination of those two.

Figure 3:
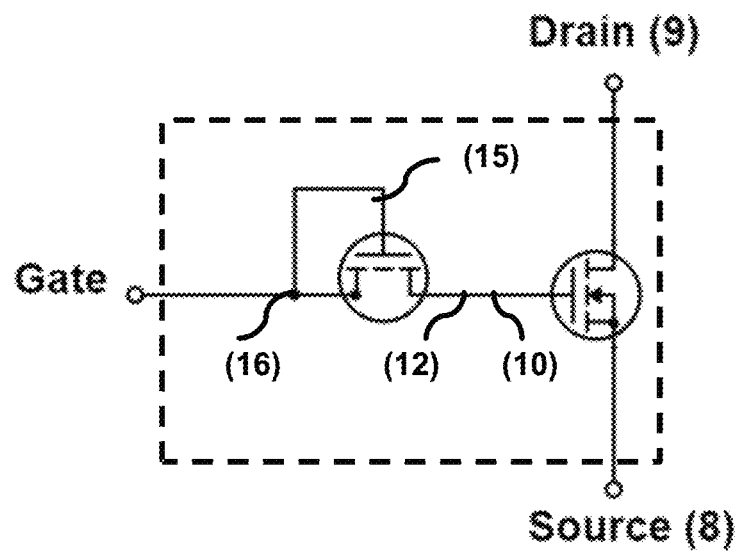
FIG. 3 shows a circuit schematic representation of one embodiment of the proposed invention as shown in the schematic cross section of FIG. 2.

FIG. 3 shows a circuit schematic representation of one embodiment of the proposed invention as shown in the schematic cross section of FIG. 2. The features shown in FIG. 3 carry the same reference numbers as the features in FIG. 2.

Figure 4:
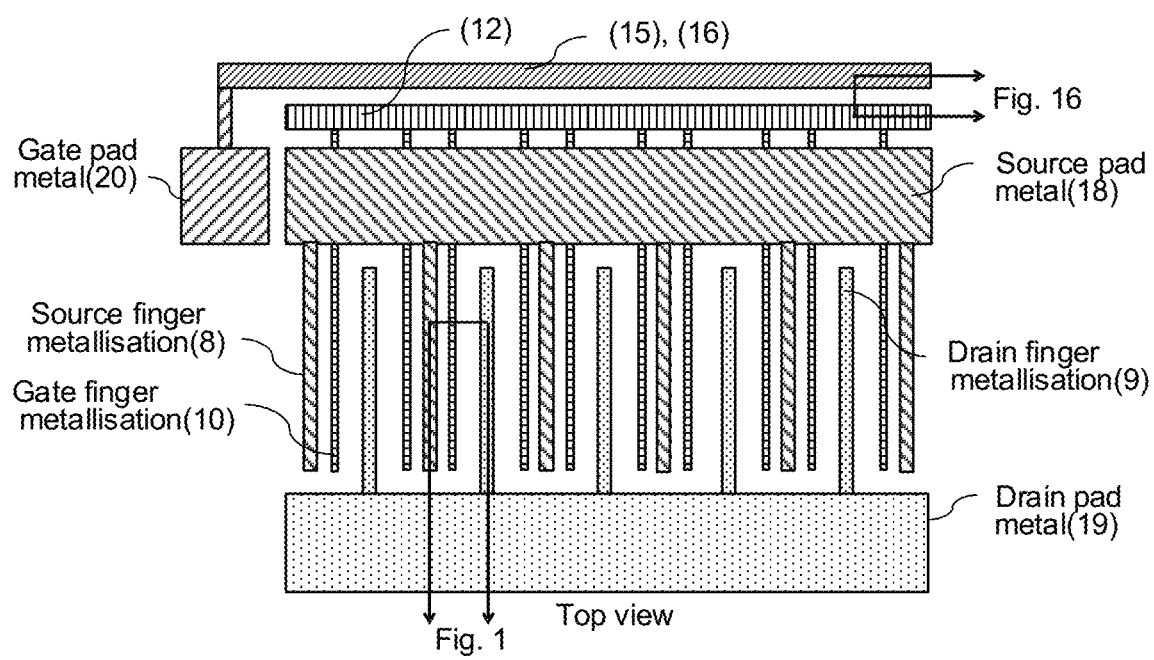
FIG. 4 illustrates an interdigitated device layout of a further embodiment of the invention incorporating an auxiliary gate structure.
Figure 5:
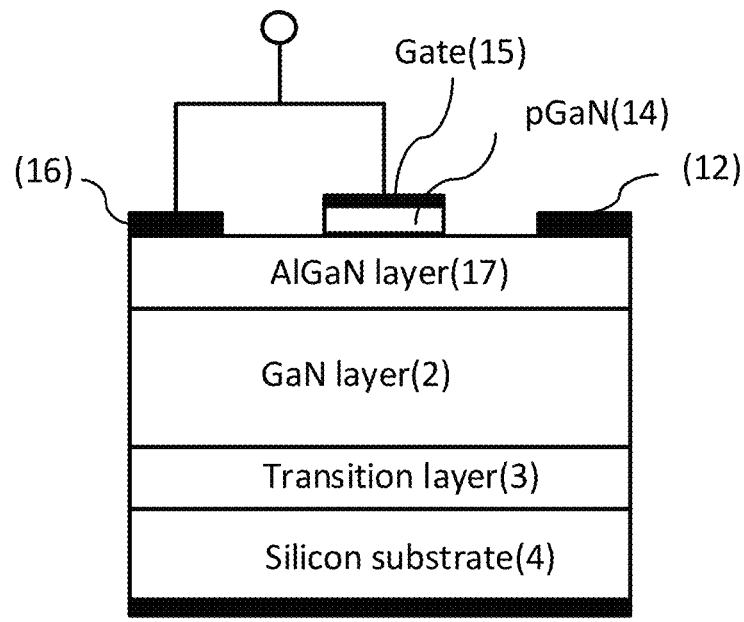
FIG. 5 shows the cross section of the auxiliary gate structure as used in the inter-digitated layout of FIG. 4.

FIG. 4 illustrates an interdigitated device layout of a further embodiment of the invention incorporating an auxiliary gate structure. Many features of this embodiment are similar to those shown in FIG. 2 and therefore carry the same reference numerals, i.e., active gate terminal 10, low voltage source terminal 8, high voltage drain terminal 9, auxiliary gate terminal 15, first additional terminal 16 and second additional terminal 12. Also shown in this illustration are the source pad metal 18, drain pad metal 19, and gate pad metal 20. However, in this embodiment rather than the gate pad metal 20 being contacted to the gate fingers 10 directly as in a state of the art device it is connected to the auxiliary gate terminals 15, 16. The gate fingers in the interdigitated structure are directly connected to the second additional terminal 12. For a better understanding of the layout the cross sections at different areas of the device are shown in FIG. 1 and FIG. 5. Note that in this layout, as in the cross sections in previous embodiments, an isolation layer exists between the 2DEG in the auxiliary gate and the active device.

Figure 6A:
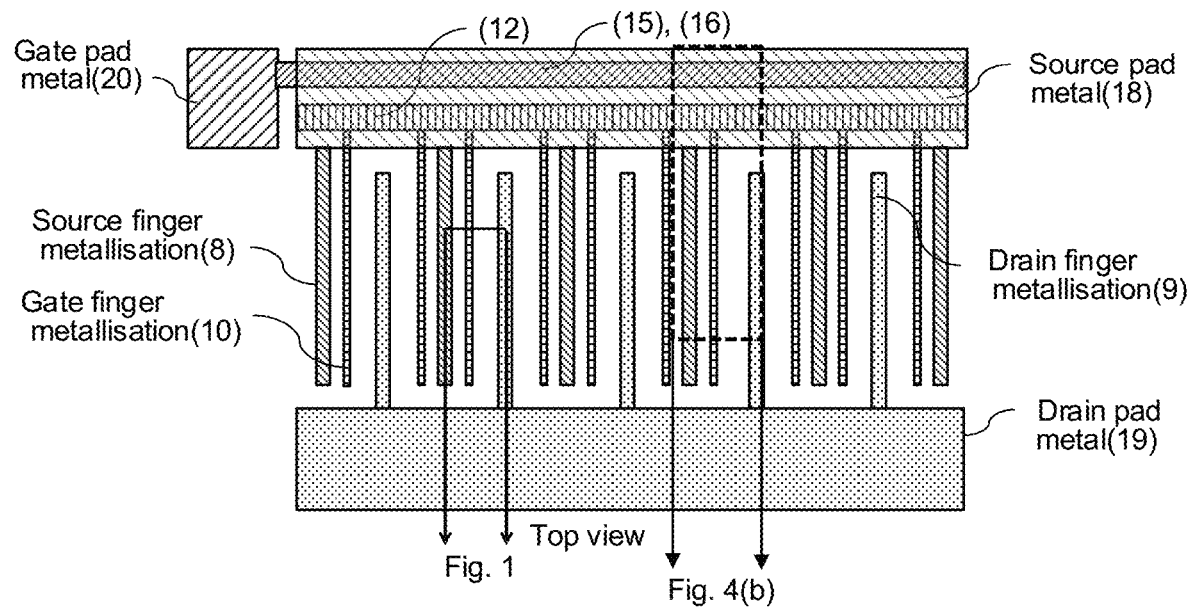
FIG. 6(a) illustrates an interdigitated device layout of a further embodiment of the invention in which the auxiliary gate and terminal regions are placed below the source pad metal.
Figure 6B:
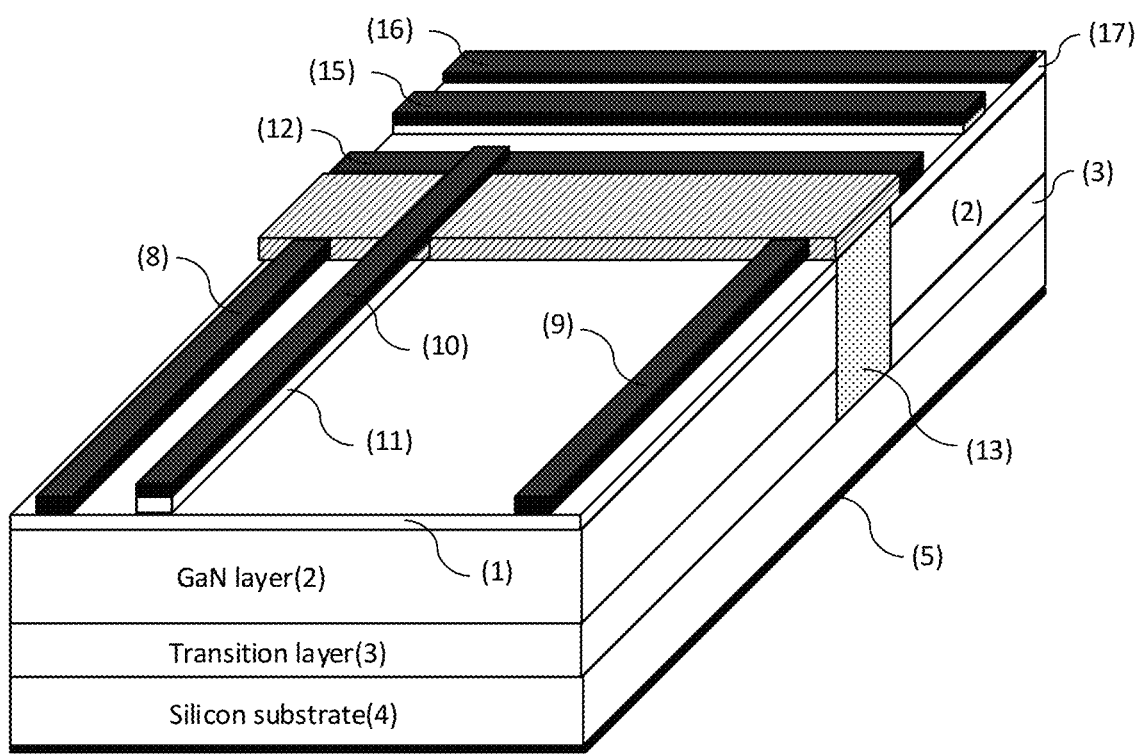
FIG. 6(b) illustrates 3D schematic representation of the embodiment of FIG. 6(a)

FIG. 6(a) illustrates an interdigitated device layout of a further embodiment of the invention in which the auxiliary gate and terminal regions are placed below the source pad metal. Many features of this embodiment are similar to those shown in FIG. 4 and therefore carry the same reference numerals, i.e., active gate terminal 10, low voltage source terminal 8, high voltage drain terminal 9, auxiliary gate terminal 15, first additional terminal 16, second additional terminal 12, source pad metal 18, drain pad metal 19, and gate pad metal 20. However, in this embodiment, the auxiliary gate 15, 16 and terminal regions are placed below the source pad metal 18. No additional wafer area would be needed to include the auxiliary gate structure compared to a state of the art design. FIG. 6(b) uses a 3D illustration to show a possible connection of active gate 10 and first additional terminals 12. In this embodiment the active and auxiliary gate cross sections are not in the same plane as in FIG. 2. Note that FIG. 6(b) only shows the surface metallisation layers. Nonetheless, multiple metallisation layers would normally be used in the layout of such a device.

Figure 7:
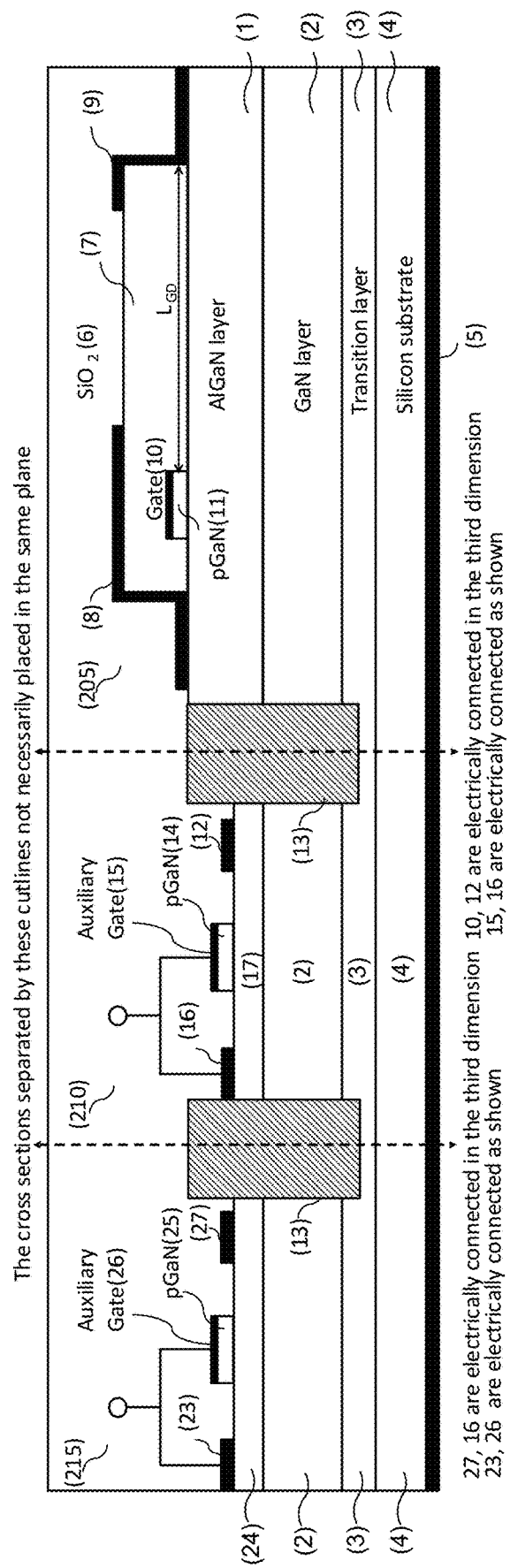
FIG. 7 illustrates a schematic representation of a cross section of the active area of a further embodiment of the invention in which a second auxiliary gate is included.

FIG. 7 illustrates a schematic representation of a cross section of the active area of a further embodiment of the invention in which a second auxiliary gate is included. Many of the features of this embodiment are similar to those of FIG. 2 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, $SiO_2$ passivation layer 6, isolation region 13, auxiliary AlGaN layer 17, auxiliary pGaN layer 14, auxiliary gate 15, first additional terminal 16 and second additional terminal 12. However, in this embodiment, a secondary auxiliary gate 26 is included in a second auxiliary device 215. The secondary auxiliary region has the same structure as that shown in previous embodiments in that it comprises a semiconductor substrate 4, a substrate terminal 5, a transition layer 3, a GaN layer 4, a secondary auxiliary AlGaN layer 24, a secondary auxiliary pGan layer 25, a secondary auxiliary gate terminal 26, a secondary first additional terminal 23, a secondary second additional terminal 27 and an additional isolation region 13. The first and secondary auxiliary gate regions 15, 26 are separated by a vertical cutline similar to the cutline separating the active gate region and the first auxiliary gate region. The cross sections separated by cutlines are not necessarily in the same plane. The secondary first additional terminal 23 is electrically connected to the secondary auxiliary gate 26. The secondary second additional terminal 27 is electrically connected to the auxiliary first additional terminal 16. More auxiliary gate-transistors can be integrated to increase the value of the threshold voltage of the high-voltage GaN device.

Figure 8A:
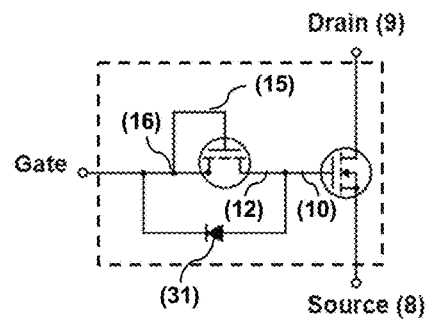
FIG. 8(a) shows a circuit schematic representation of a further embodiment of the proposed invention in which a low on-state voltage diode is connected in parallel between the drain and the source of the low-voltage transistor.
Figure 8B:
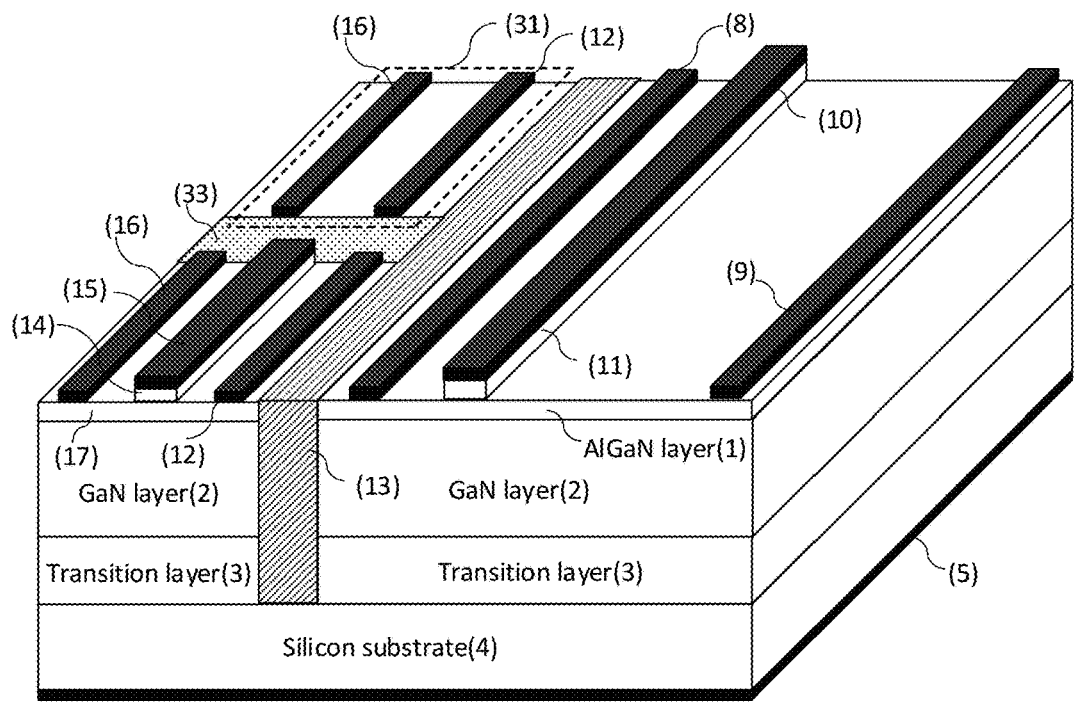
FIG. 8(b) illustrates a 3D schematic representation of the embodiment of FIG. 8(a)
Figure 8C:
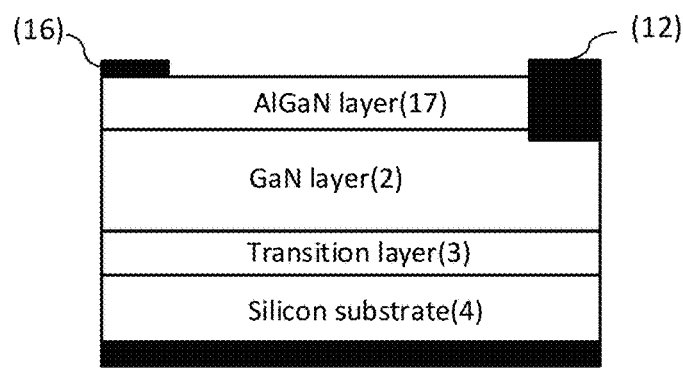
FIG. 8(c) shows the cross section of the low voltage diode as used in embodiment of FIG. 8(a)

FIG. 8(a) shows a circuit schematic representation of a further embodiment of the proposed invention in which a low on-state voltage diode is connected in parallel between the drain and the source of the low-voltage transistor, as shown in the schematic 3D illustration in FIG. 8(b). Many of the features of this embodiment are similar to those of FIG. 2 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, $SiO_2$ passivation layer 6, isolation region 13, auxiliary AlGaN layer 17, auxiliary pGaN layer 14, auxiliary gate 15, first additional terminal 16 and second additional terminal 12. However, in this embodiment a low on-state voltage diode 31 is connected in parallel between the drain 12 and the source 16 of the low-voltage transistor. The parallel diode 31 acts as pull-down network during the turn-off of the overall configuration connecting to ground the gate terminal 10 of the active GaN transistor. When a positive bias (known as on-state) is applied to the auxiliary gate 16, the diode 31 will be reverse-biased and zero current will flow through it, leaving unaffected the electrical behaviour of the overall high-voltage configuration. When a zero bias (off-state) will be applied to the auxiliary gate 16 the diode 31 will be forward bias and the turn-off current flowing through it will discharge the gate capacitance of the active transistor, thus enabling the switching off of the overall configuration. In off-state, the gate of the active device 10 will remain biased to a minimum voltage equal to the turn-on voltage of the diode. The diode 31 will therefore be designed in such a way that its turn-on voltage will be as low as possible, ideally few mV. FIG. 8(b) illustrates how the diode 31 could be included monolithically. The diode could be a simple Schottky diode or could be a normal p-n diode. The diode 31 would pull down the active gate 10 during turn-off to the diode $V_{th}$, therefore the diode needs to be designed to have as low a threshold voltage as possible. A feature which can achieve this is the use of a recessed anode such that the contact is made directly to the 2DEG as seen in FIG. 8 (c).

Figure 9A:
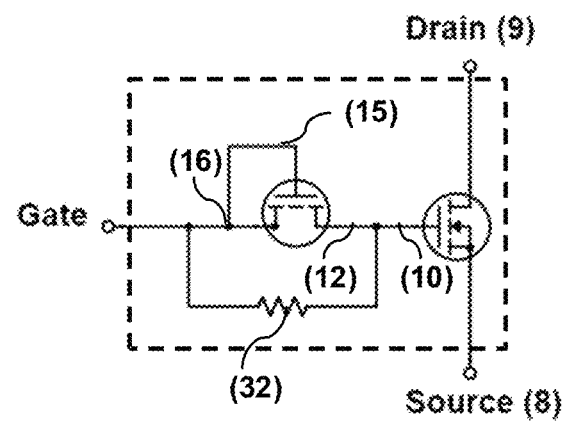
FIG. 9(a) shows a circuit schematic representation of a further embodiment of the proposed invention in which a relatively high value resistor is connected in parallel between the drain and the source of the low-voltage transistor.

FIG. 9(a) shows a circuit schematic representation of a further embodiment of the proposed invention in which a high value resistor is connected in parallel between the drain and the source of the low-voltage transistor. Many of the features of this embodiment are similar to those of FIG. 2 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, SiO$_2$ passivation layer 6, isolation region 13, auxiliary AlGaN layer 17, auxiliary pGaN layer 14, auxiliary gate 15, first additional terminal 16 and second additional terminal 12. However, in this embodiment, a high value resistor 32 is connected in parallel between the drain 12 and the source (gate) 16 of the low-voltage transistor. The parallel resistor 32 acts as a pull-down network during the turn-off of the overall configuration connecting to ground the gate terminal 10 of the active GaN transistor. As a consequence, zero voltage will be applied to the gate 10 of the active device when zero current is flowing into the resistor 32. The resistor 32 will need to be chosen or designed as a relatively high value resistor (for example, about 500 ohm or more). In this way, the resistor will not take any conducting current during the on-state operation of the device.

Figure 9B:
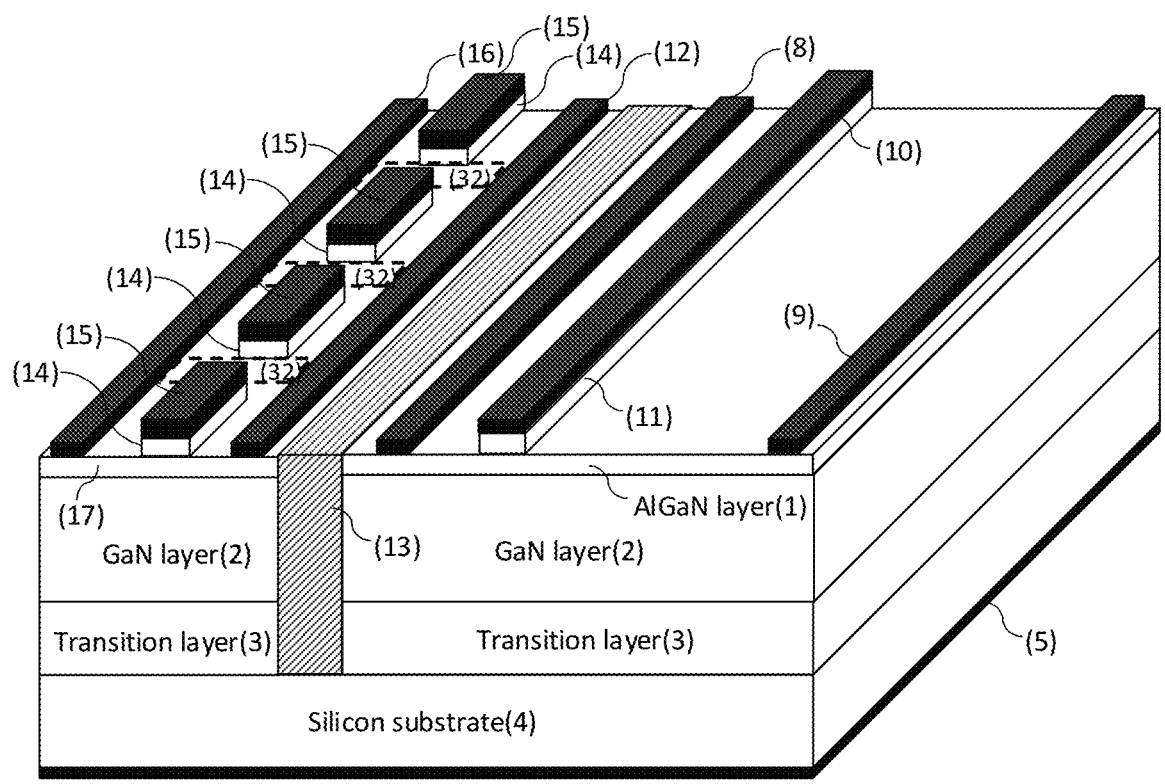
FIG. 9(b) is a schematic 3D illustration of the embodiment shown in FIG. 9(a)

FIG. 9(b) is a schematic 3D illustration of the embodiment shown in FIG. 9(a). This illustrates how the parallel resistance 32 could be included in the design monolithically. Sections of the auxiliary gate 15/pGaN 14 are removed such that the 2DEG beneath those sections is always present and can act as a resistance which can pull down the real gate voltage during turn-off. This resistance needs to be large during turn-on/on-state to see the benefits of the auxiliary gate 15 on the device characteristics. However, it needs to be small during turn-off to allow a fast turn-off. Therefore, there is a trade-off between auxiliary gate turn-on benefits and speed of turn-off.

Figure 10A:
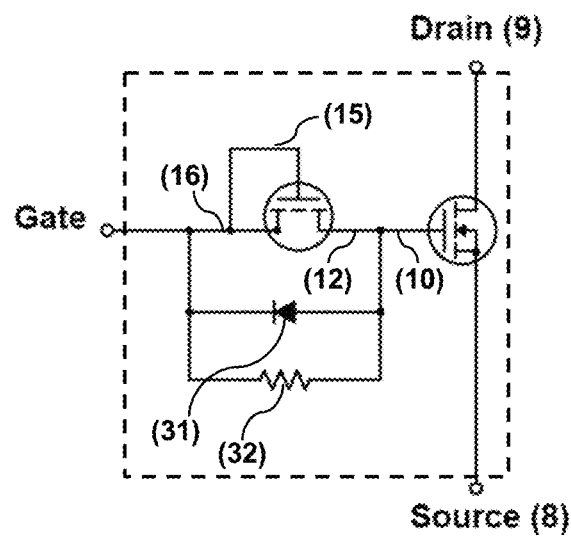
FIG. 10(a) shows a circuit schematic representation of a further embodiment of the proposed invention in which a low on-state voltage diode and high-voltage resistor are connected in parallel between the drain and the source (gate) of the low-voltage transistor.

FIG. 10(a) shows a circuit schematic representation of a further embodiment of the proposed invention in which a low on-state voltage diode and high-voltage resistor are connected in parallel between the drain and the source (gate) of the low-voltage transistor. Many of the features of this embodiment are similar to those of FIG. 2 and therefore carry the same reference numerals, i.e., the semiconductor substrate 4, substrate terminal 5, transition layer 3, GaN layer 2, AlGaN layer 1, active pGaN layer 11, active gate terminal 10, surface passivation dielectric 7, low voltage source terminal 8, high voltage drain terminal 9, SiO$_2$ passivation layer 6, isolation region 13, auxiliary AlGaN layer 17, auxiliary pGaN layer 14, auxiliary gate 15, first additional terminal 16 and second additional terminal 12. However, in this embodiment, a parallel network of a low on-state voltage diode 31 and high resistor 32 is connected in parallel between the drain 12 and the source (gate) 16 of the low-voltage transistor. The parallel connection of the diode 31 and resistor 32 will act as a pull-down network during the turn-off of the overall configuration.

Figure 10B:
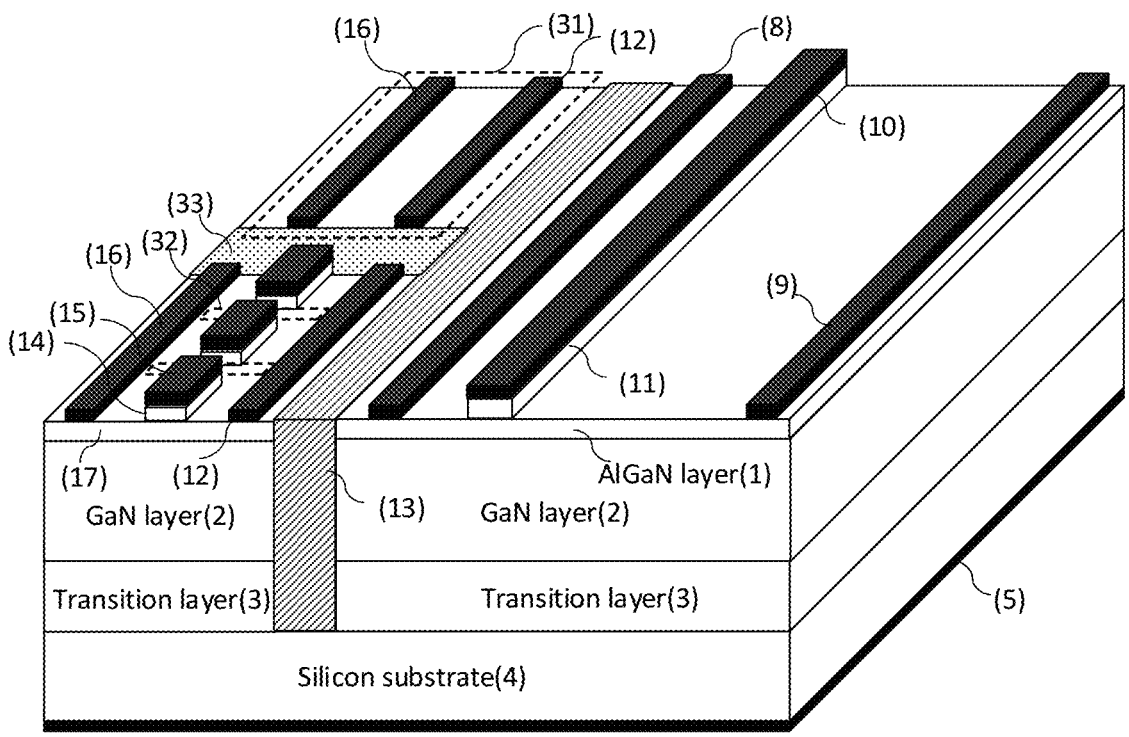
FIG. 10(b) is a schematic 3D illustration of the embodiment shown in FIG. 10(a).

FIG. 10(b) is a schematic 3D illustration of the embodiment shown in FIG. 10(a). This illustrates how the diode 31 and resistor 32 could be included in the design monolithically.

In additional embodiments of this invention the heterojunction device described may be connected in series with a low voltage power (e.g. blocking voltage rating of 5V-50V) Si MOSFET where the source terminal (first terminal) of the heterojunction device is connected to the drain terminal of the Si MOSFET. In these embodiments the auxiliary gate device described may act as an interface between an external control terminal and the active gate terminal enabling the heterojunction device and MOSFET to be driven from a common driving signal using a single gate driver. The external control terminal (connected as the second interface terminal) and the Si MOSFET gate terminal may be operatively connected in these embodiments.

Additionally, this disclosure is intended to include embodiments where the external control terminal and Si MOSFET gate terminal may be connected via a resistive element, a passive element, an element which introduces a time delay or other circuit elements available to someone skilled in the art in a manner whereby the scope and objectives of the invention disclosed remain unchanged.

Figure 11:
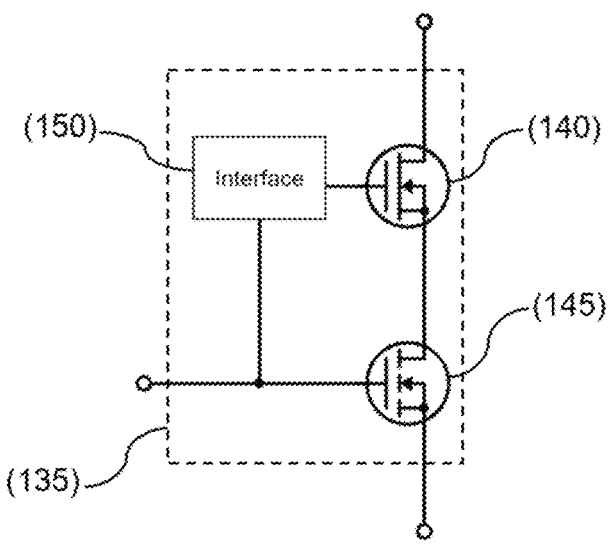
FIG. 11 shows schematically a heterojunction device in series with a power MOSFET where the heterojunction device used is a depletion mode HEMT.

FIG. 11 shows schematically a heterojunction device 140 such as a HEMT in series with a low voltage power MOSFET 145 in a power device 135. In some embodiments, the heterojunction device used may be a depletion mode (normally on) HEMT. In addition or alternatively, a heterojunction device with a threshold voltage close to zero volts, which could be either normally on or normally off depending on the operating conditions 140.

An additional interface 150 may be provided to enable the HEMT 140 to be driven with the same gate driver used to drive the Si MOSFET 145. The interface 150 may be implemented monolithically with the pGaN HEMT 140. An example of such an additional interface is described in the PCT publication WO/2019/012293A1 and the USPTO publication US/2019/0267482A1. The above arrangement 135 could be co-packaged or be configured with discrete components. In this arrangement the absolute value of the threshold voltage of the depletion mode HEMT 140 is intended to be smaller than the blocking voltage rating of the low voltage power MOSFET 145.

Figure 12:
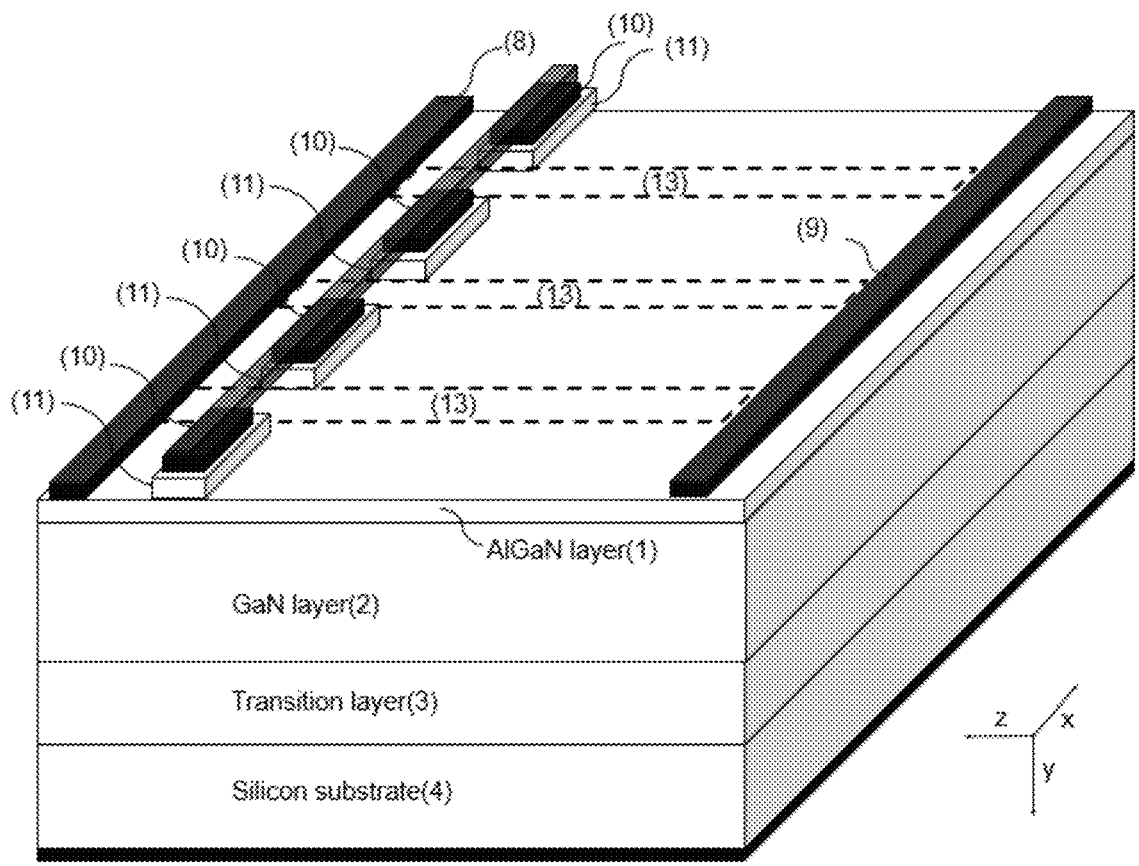
FIG. 12 illustrates a 3D schematic representation of a depletion mode HEMT.

FIG. 12 shows an exemplary p-GaN island depletion mode HEMT, also referred to as a pGaN HEMT, for use in power device 135 of FIG. 11. Alternatively, the HEMT used may be a conventional Schottky gate D-HEMT.

The depletion mode HEMT 140 may be connected, for example in series, with a low voltage power Silicon (Si) MOSFET 145. In some embodiments, the source terminal 8 of the heterojunction device 140 may be connected to the drain terminal of the Si MOSFET 145. The threshold voltage of the pGaN HEMT may be lower than the threshold voltage of the Si MOSFET 145. Additionally or alternatively, the maximum allowable gate voltage of the pGaN HEMT 140 may be lower than the maximum allowable gate voltage of the Si MOSFET 145.

A power device with arrangement 135 has several advantages over prior art. Compared to an enhancement mode (normally off) HEMT in the prior art (such as FIG. 1). For example, power device 135 may have better reverse conducting performance. Prior art devices have limited reverse conducting performance due to the absence of a body diode in GaN HEMTs. Reverse conduction in power device 135 occurs through the body diode of the power MOSFET 145 and/or the regions 13 between the pGaN islands 11 where the two dimensional carrier gas, which may be a two dimensional electron gas (2DEG), has a high carrier concentration at zero bias. Alternatively, the reverse conduction can further be enhanced by an active control of the gate terminal during this mode. When the potential applied to the gate terminal of the MOSFET 145 is larger (or significantly large—for example 10V) than that of the source terminal of the unipolar transistor 145 (e.g. 0V with a MOSFET threshold voltage of 3V), the reverse conduction current flows through the MOSFET channel of the unipolar transistor of 145. Moreover, since in this case the 2DEG is formed in substantially all of the active gate region (which may include being formed in both the area between the pGaN islands and under the pGaN islands), the reverse conduction current will continue to flow from the MOSFET through a wider 2DEG of the heterojunction device 140 thus leading to lower on-state losses during the reverse conduction mode. At larger currents, the current in the reverse conduction mode may flow through both the channel and the body diode of the transistor 145.

Furthermore, the use of the depletion mode device of FIG. 12 in arrangement 135 offers an advantage over a more conventional Schottky gate depletion mode device (FIG. 2) as in the forward conduction mode it permits the forward bias of the gate terminal 10 and therefore a strong 2DEG carrier concentration in the 2DEG channel. In some embodiments of the invention, this strong 2DEG carrier concentration may also be achieved in the reverse conduction mode. The strong 2DEG concentration is not possible with a standard Schottky gate D-HEMT, as forward biasing the Schottky contact will result in excessive gate current. This arrangement may therefore lead to a device with an overall improved specific RDSon.

Figure 13:
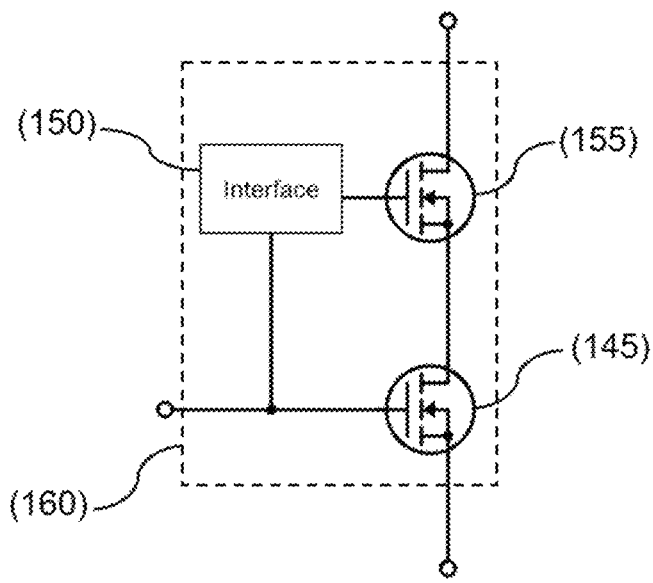
FIG. 13 shows schematically a heterojunction device in series with a power MOSFET where the heterojunction device used is an enhancement mode HEMT.

FIG. 13 shows schematically a heterojunction device 155 in series with a power MOSFET 145 where the heterojunction device used is an enhancement mode (normally off) HEMT 155 in a power device 160 according to an embodiment of the present disclosure;

The enhancement mode HEMT 155 may be connected in series with a low voltage power Silicon MOSFET 145. In some embodiments, the source terminal of the heterojunction device 155 may be connected to the drain terminal of the Si MOSFET 145. The threshold voltage of the pGaN HEMT is lower than the threshold voltage of the Si MOSFET and in some embodiments could be close to zero volts. The heterojunction device features an interface 150 to allow driving the HEMT using the same gate driver used to drive the Si MOSFET. The interface 150 may be implemented monolithically with the pGaN HEMT. An example of such an additional interface is described in the PCT publication WO/2019/012293A1 and the USPTO publication US/2019/0267482A1. The above arrangement could be co-packaged or be configured with discrete components. In some embodiments the absolute value of the threshold voltage of the enhancement mode HEMT 155 may be smaller than the blocking voltage rating of the power MOSFET 145. The enhancement mode HEMT used in this embodiment may be the exemplary HEMT shown in FIG. 14, however other enhancement mode heterojunction devices may also be utilised.

A power device with arrangement 160 may be more reliable than the stand alone pGaN HEMT in prior art (FIG. 1). The pGaN HEMT has a relatively low threshold voltage (compared to an Si MOSFET) and therefore has a risk of re-triggering during transient operation due to parasitic components present in an application circuit. An externally applied negative gate to source voltage by driving the gate negatively is often recommended (GN001 Application Guide Design with GaN Enhancement mode HEMT, GaN Systems Inc., February 2018.) to avoid this effect.

In this embodiment, when power device 160 is in the off-state the drain terminal of the Si MOSFET is set at a given potential above ground creating a negative gate to source voltage for the enhancement mode HEMT. This method is commonly described as source control (as opposed to gate control of a device). Therefore, in arrangement 160 the negative gate to source voltage for the HEMT which is recommended to avoid re-triggering may be achieved through source control of the HEMT and can avoid the complication of generating a negative voltage on the driving side. As opposed however to a typical device that has only source control, the power device 160 features both source and gate control, as during switching, and on-state, the gate potential of the HEMT is controlled to modulate the 2DEG layer of the HEMT.

The embodiment illustrated in FIG. 13 may result in higher losses during reverse conduction mode compared to earlier embodiments which use depletion mode transistors as the heterojunction transistor. To reduce losses when power device 160 is in reverse conduction mode the reverse conduction may be further enhanced by an active control of the gate terminal during this mode as described above.

Figure 14:
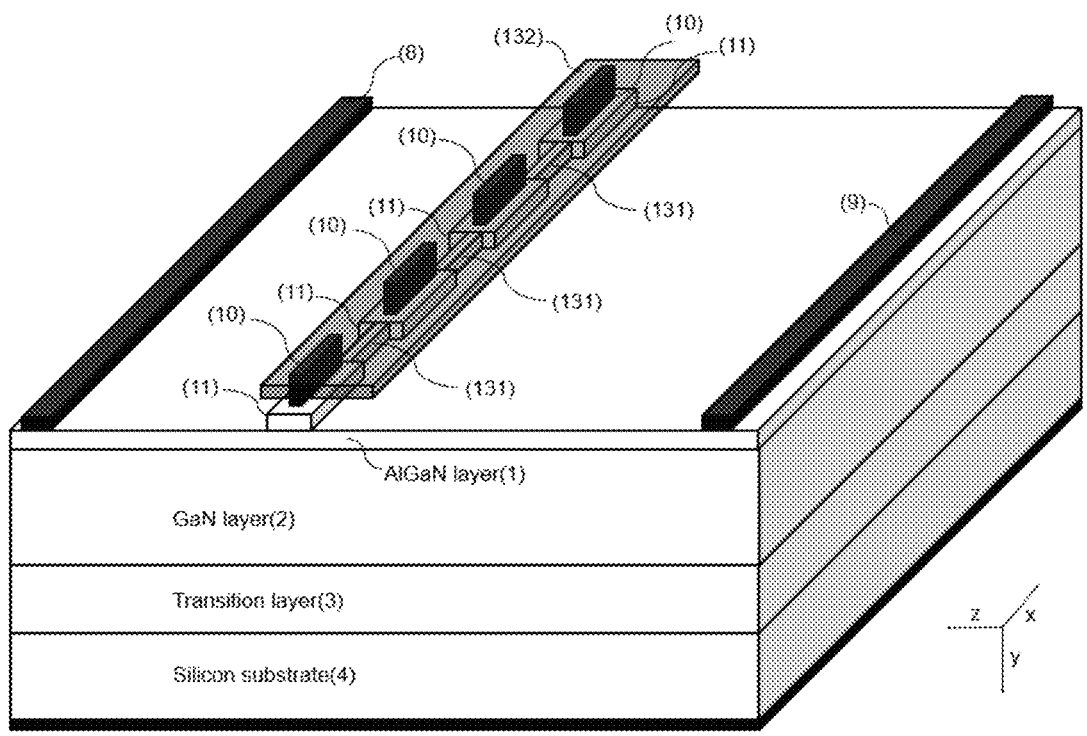
FIG. 14 shows a schematic perspective view of a device configured to reduce the specific on-resistance according to a further embodiment of the disclosure.

FIG. 14 shows a schematic perspective view of a device configured to reduce the specific on-resistance according to a further embodiment of the disclosure.

Optionally, the at least two highly doped semiconductor regions or pGaN islands 11 may be connected with additional regions of highly doped semiconductor 131, of the same conductivity type as the islands 11. The additional regions described may be narrower (i.e. shorter in length) than the at least two highly doped semiconductor regions. The length parameter in this description is defined along the direction of the current flow between the source terminal 8 and the drain terminal 9 (along the z-axis). The additional regions may be manufactured in the same process step as the islands 11, or alternatively may be manufactured in a separate step.

The additional regions are not connected to the gate metallisation/terminal 132 directly via a metal or contacts or vias and the carrier density of the 2DEG channel directly underneath them along the y-axis is dependent on the potential of the gate contact 10 on the pGaN islands 11. In additional embodiments (not shown) a gate contact 10 may be operatively connected to the regions 131 directly.

In general, the on-state resistance of a HEMT is the summation of at least the metal contact resistance of the source 8 and drain terminal 9, the source 8 to gate 132 2DEG resistance, the channel resistance (i.e. 2DEG in regions underneath any pGaN) and the drift region resistance (i.e. gate 132 to drain 9 2DEG resistance). In some embodiments the channel resistance is a critical parameter. Therefore, by reducing the length of the channel along the direction of the current flow (along z-axis) the total resistance may be reduced.

The narrower regions of highly doped semiconductor can therefore lead to a device with reduced specific on-state resistance compared to a device with a continuous region of highly doped semiconductor as in prior art.

The configuration in this embodiment may lead to a reduction of the threshold voltage of the device compared to the device with a continuous region of highly doped semiconductor in prior art but may have an increased threshold voltage (that is less negative or even positive) compared to the device in FIG. 12 where the at least two highly doped semiconductor regions (pGaN islands 11) are spaced apart from each other and unconnected by the additional regions of highly doped semiconductor 131.

The device described in this embodiment may become a normally-on device if an increased polarization charge exists at the AlGaN layer 1/GaN layer 2 interface (leading to a 2DEG with an increased carrier density). This for example may be achieved if the additional regions are very narrow or through the use of a thicker AlGaN barrier layer 1 or an increased Aluminium mole fraction, or any combination of the above.

To ensure good off-state operation the device described in this embodiment may need to be driven during the turn-off or off-state with a negative gate bias voltage (even if the threshold is nominally positive) to avoid punch through and/or excessive off-state drain to source leakage occurring.

Figure 15:
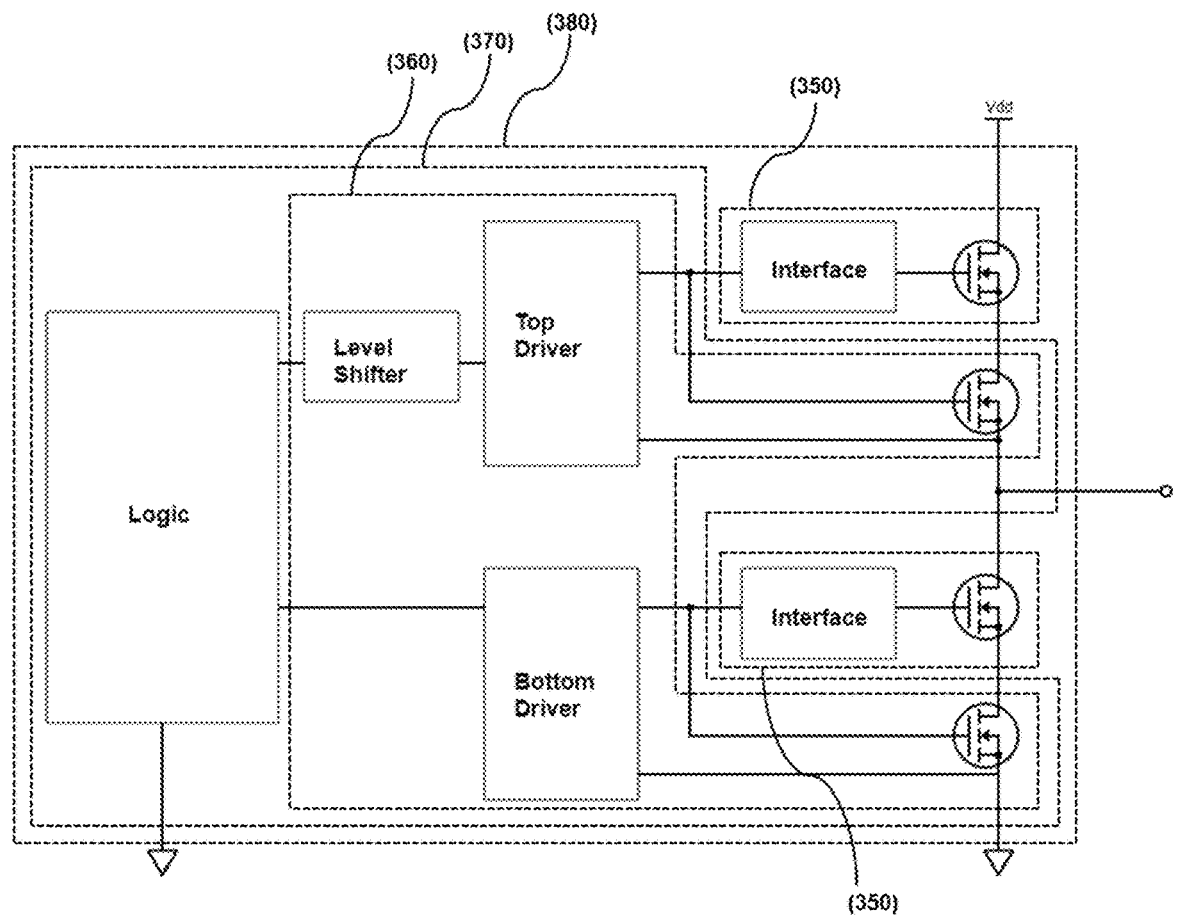
FIG. 15 shows a block diagram of a further embodiment of the proposed invention.

FIG. 15 shows a block diagram of a further embodiment of the proposed invention where the co-driven heterojunction device and MOSFET device (135, 160, 165, 180, 190, 200) is placed in a half bridge configuration, and the external gate of the two transistors (both high and low side) is connected to gate driving blocks which are in turn connected to logic blocks. The different components and blocks included in the figure can be discrete components or connected monolithically. Different combinations of the building blocks shown could be included monolithically (350, 360, 370, 380). The possible combinations are not limited to those shown in FIG. 15 which is used for illustration purposes only.

Figure 16:
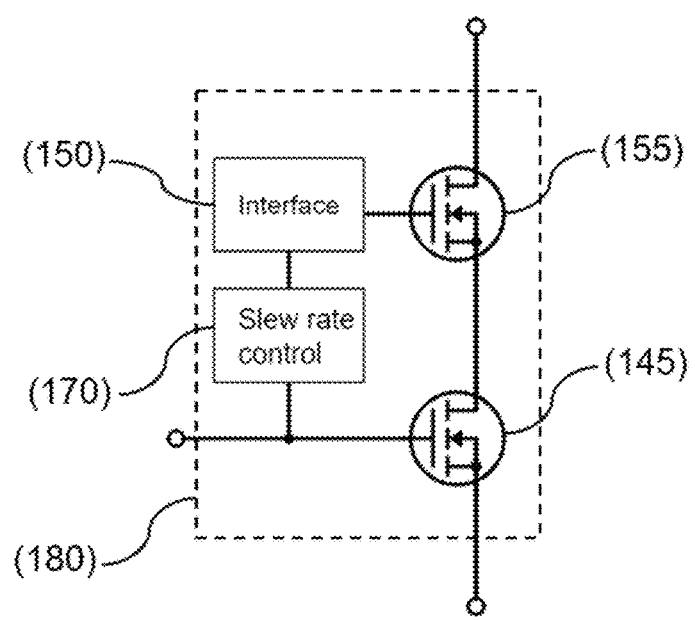
FIG. 16 shows schematically a heterojunction device in series with a power MOSFET, with a HEMT driver interface and slew rate control blocks.
Figure 17:
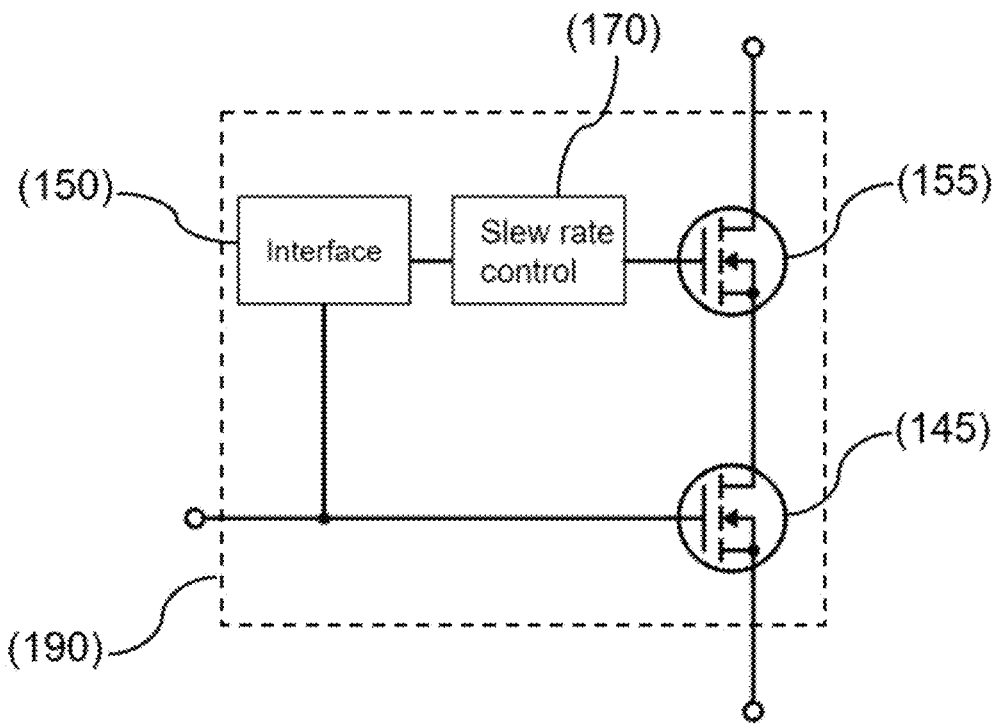
FIG. 17 shows schematically a heterojunction device in series with a power MOSFET, with a HEMT driver interface and slew rate control blocks.

FIGS. 16 and 17 show schematically power devices 180 and 190 respectively. Power devices 180 and 190 are similar to power device 160 of FIG. 13 but include a further slew-rate control block 170 connected in series with the interface 150. This control block 170 could be a static device such as a resistance attached to either side of the interface 150 or a dynamic slew rate control block. The slew rate could be also adjusted externally by a controller or processor (not shown). Additionally or alternatively to interface 150, slew rate control block 170 may be implemented monolithically with the pGaN HEMT. Alternatively, slew-rate control block 170 may be incorporated into power device 135 of FIG. 11.

Figure 18:
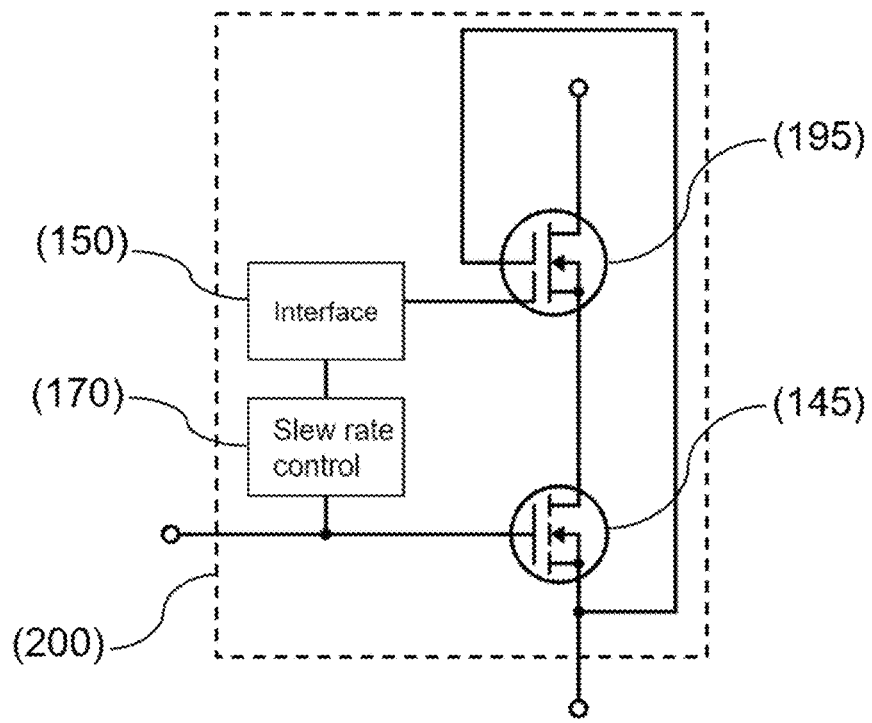
FIG. 18 shows schematically a double gated heterojunction device in series and in a Cascode configuration with a power MOSFET, with a HEMT driver interface and slew rate control blocks.
Figure 19:
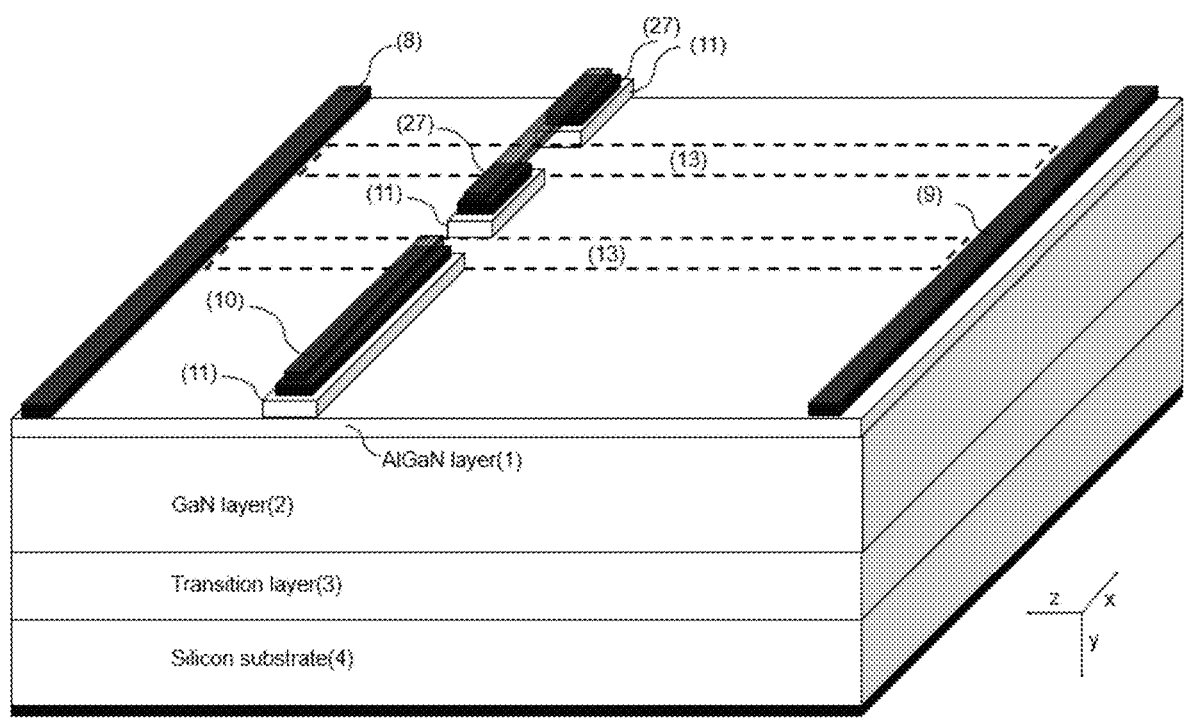
FIG. 19 illustrates a 3D schematic representation of a double gated HEMT.

FIG. 18 shows schematically a double gated heterojunction device 195 in series with a power MOSFET 145 in power device 200. In embodiments, the heterojunction device 195 may be the double gated HEMT illustrated schematically in FIG. 19. In this example, terminal 10 may be connected to the interface block 150 whereas terminal 27 may be connected to the source terminal of the MOSFET device 145 or ground. Such an embodiment can provide a good trade-off between a good reverse recovery of the depletion mode structure (normally-on structure with gate terminal 27) and the possibility of additional current density and the slew rate control of the enhancement mode structure (normally-off structure with gate terminal 10).

It will also be appreciated that terms such as "top" and "bottom", "above" and "below", "lateral" and "vertical", and "under" and "over", "front" and "behind", "underlying", etc. may be used in this specification by convention and that no particular physical orientation of the device as a whole is implied.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

REFERENCES

[1] U. K. Mishra et al., GaN-Based RF power devices and amplifiers, Proc. IEEE, vol 96, no 2, pp 287-305, 2008.
[2] M. H. Kwan et al, CMOS-Compatible GaN-on-Si Field-Effect Transistors for High Voltage Power Applications, IEDM, San Fran., December 2014, pp 17.6.1-17.6.4
[3] S. Lenci et al., Au-free AlGan/GaN power diode 8-in Si substrate with gated edge termination, Elec. Dev. Lett., vol 34, no 8, pp 1035, 2013.
[4] T. Oka and T. Nozawa, IEEE Electron Device Lett., 29, 668 (2008).
[5] Y. Cai, Y. Zhou, K. J. Chen, and K. M. Lau, IEEE Electron Device Lett., 26, 435 (2005)
[6] W. Saito, Y. Takada, M. Kuraguchi, K. Tsuda, and I. Omura, IEEE Trans. Electron Devices, 53, 356, (2006).
[7] Y. Uemoto, M. Hikita, H. Ueno, H. Matsuo, H. Ishida, M. Yanagihara, T. Ueda, T. Tanaka, and D. Ueda, IEEE Trans. Electron Devices, 54, 3393 (2007).
[8] I. Hwang, H. Choi, J. Lee, H. S. Choi, J. Kim, J. Ha, C. Y. Um, S. K. Hwang, J. Oh, J. Y. Kim, J. K. Shin, Y. Park, U. I. Chung, I. K. Yoo, and K. Kim, Proc. ISPSD, Bruges, Belgium, p. 41 (2012).
[9] M. J. Uren, J. Moreke, and M. Kuball, IEEE Trans. Electron Devices, 59, 3327 (2012).
[10] L. Efthymiou et al, On the physical operation and optimization of the p-GaN gate in normally-off GaN HEMT devices, Appl. Phys. Lett., 110, 123502 (2017)
[11] GS66504B, GaN Systems, Ottawa, Canada.
[12] Infineon 650V CoolMOS C7 Power Transistor IPL65R130C7.
[13] L. Efthymiou et al, On the Source of Oscillatory Behaviour during Switching of Power Enhancement Mode GaN HEMTs, Energies, vol. 10, no. 3, 2017
[14] F. Lee, L. Y. Su, C. H. Wang, Y. R. Wu, and J. Huang, "Impact of gate metal on the performance of p-GaN/AlGaN/GaN High electron mobility transistors," IEEE Electron Device Lett., vol. 36, no. 3, pp. 232-234, 2015.
[15] O. Ambacher, J. Smart, J. R. Shealy, N. G. Weimann, K. Chu, M. Murphy, W. J. Schaff, L. F. Eastman, R. Dimitrov, L. Wttmer, M. Stutzmann, W. Rieger, and J. Hilsenbeck, "Two-dimensional electron gases induced by spontaneous and piezoelectric polarization charges in N- and Ga-face AlGaN/GaN heterostructures," J. Appl. Phys., vol. 85, no. 6, p. 3222, 1999.
[16] Okita, H., Hikita, M., Nishio, A., Sato, T., Matsunaga, K., Matsuo, H., Mannoh, M. and Uemoto, Y., 2016, June. Through recessed and regrowth gate technology for realizing process stability of GaN-GITs. In Power Semiconductor Devices and ICs (ISPSD), 2016 28th International Symposium on (pp. 23-26). IEEE.

[17] Lu, B., Saadat, O. I. and Palacios, T., 2010. High-performance integrated dual-gate AlGaN/GaN enhancement-mode transistor. IEEE Electron Device Letters, 31(9), pp. 990-992.

[18] Yu, G., Wang, Y., Cai, Y., Dong, Z., Zeng, C. and Zhang, B., 2013. Dynamic characterizations of AlGaN/GaN HEMTs with field plates using a double-gate structure. IEEE Electron Device Letters, 34(2), pp. 217-219

[19] Feng, P., Teo, K. H., Oishi, T., Yamanaka, K. and Ma, R., 2013, May. Design of enhancement mode single-gate and doublegate multi-channel GaN HEMT with vertical polarity inversion heterostructure. In Power Semiconductor Devices and ICs (ISPSD), 2013 25th International Symposium on (pp. 203-206). IEEE

[20] Xiaobin, X. I. N., Pophristic, M. and Shur, M., Power Integrations, Inc., 2013. Enhancement-mode HFET circuit arrangement having high power and high threshold voltage. U.S. Pat. No. 8,368,121.

The invention claimed is:

1. A device comprising:
   a heterojunction device comprising a first heterojunction terminal, a second heterojunction terminal and a heterojunction gate terminal operatively connected to an active gate region;
   a unipolar power transistor operatively connected in series with said heterojunction device;
   an interface unit comprising a first interface terminal and a second interface terminal, wherein the first interface terminal is operatively connected to the heterojunction gate terminal, and wherein the second interface terminal is configured as a gate switching terminal,
   wherein the interface unit controllably increases the threshold voltage of the heterojunction device, when the threshold voltage relates to a potential applied to the second interface terminal,
   wherein a threshold voltage of said heterojunction device is less than a threshold voltage of said unipolar power transistor and is less than a blocking voltage of said unipolar power transistor,
   wherein the unipolar power transistor is a silicon based power metal oxide semiconductor field effect transistor (MOSFET), the unipolar power transistor comprising a first silicon terminal, a second silicon terminal and a third silicon gate terminal, and wherein the second silicon terminal is operatively connected to the first heterojunction terminal and wherein the silicon gate terminal is operatively connected to the second interface terminal,
   wherein said heterojunction device is a III-nitride semiconductor based heterojunction device, and wherein said active gate region of the heterojunction device comprises a p-type gallium nitride (pGaN) material, and
   wherein the heterojunction device and the unipolar power transistor are operable using a single control signal during switching of the device.

2. The device according to claim 1, wherein an absolute value of the gate threshold voltage of the heterojunction device is less than a blocking voltage of said unipolar power transistor.

3. The device according to claim 1 where the threshold voltage of the heterojunction device related to the potential applied to the second interface terminal is about the same or close to the threshold voltage of the unipolar power transistor.

4. The device according to claim 1, wherein the interface unit increases an operating voltage range of the heterojunction device when the operating voltage range relates to a potential applied to the second interface terminal.

5. The device according to claim 1, wherein the interface unit is monolithically integrated with the heterojunction device and comprises at least one heterojunction transistor.

6. The device according to claim 1, further comprising a slew rate control unit in series with the interface unit, wherein said slew rate control unit is controllably adjusts at least one of a speed (slew rate) and a delay time during switching of the heterojunction device.

7. The device according to claim 1, wherein the threshold voltage of the heterojunction device is greater than or equal to zero volts.

8. The device according to claim 1, wherein the threshold voltage of the heterojunction device is less than zero volts.

9. The device according to claim 1,
   wherein said heterojunction device further comprises:
      a substrate;
      an active heterojunction transistor formed on the substrate in a first dimension, the active heterojunction transistor comprising:
         a III-nitride semiconductor region comprising a first heterojunction comprising an active two dimensional carrier gas;
         the first terminal operatively connected to the III-nitride semiconductor region;
         the second terminal laterally spaced from the first terminal in a second dimension and operatively connected to the III-nitride semiconductor region;
         the heterojunction gate terminal connected to at least part of the active gate region formed over the III-nitride semiconductor region and between the first terminal and the second terminal.

10. The device according to claim 1, wherein the active gate region of the heterojunction device comprises a plurality of pGaN islands separated in a third dimension, wherein the threshold voltage of the heterojunction device is related to a size of a separation between adjacent pGaN islands, and wherein the third dimension is perpendicular to the second dimension.

11. The device of claim 10, wherein during an on-state forward conduction mode at least one of:
   a potential applied to the second terminal of the heterojunction device is greater than a potential applied to the silicon first terminal;
   the potential applied to the second interface terminal is greater than the threshold voltage of the unipolar device;
   a two dimensional carrier gas is formed in substantially all of the active gate region of the heterojunction device; and
   a current in the forward conduction mode flows through the two-dimensional carrier gas and the unipolar silicon device.

12. The device of claim 10, wherein during an on-state reverse conduction mode at least one of:
   a potential applied to the second terminal of the heterojunction device is smaller than a potential applied to the silicon first terminal;
   the potential applied to the second interface terminal is approximately equal to the potential applied to the silicon first terminal;
   a two dimensional carrier gas is formed between at least some of the plurality of pGaN islands; and
   a current in a reverse conduction mode flows through the two dimensional carrier gas and a body diode of the unipolar silicon device.

13. The device of claim 10, wherein during an on-state reverse conduction mode at least one of:
- a potential applied to the second terminal of the heterojunction device is less than a potential applied to the silicon first terminal;
- the potential applied to the second interface terminal is greater than the potential applied to the silicon first terminal, optionally wherein a difference between the potential applied to the second interface terminal and the potential applied to the silicon first terminal is greater than the threshold voltage of the unipolar device;
- a two dimensional carrier gas is formed in substantially all of the active gate region of the heterojunction device; and
- a current in a reverse conduction mode flows through the two dimensional carrier gas and the unipolar silicon device or a body diode of the unipolar silicon device.

14. The device according to claim 10, wherein the heterojunction device is a normally-on device, and wherein the threshold voltage of the heterojunction device is related to at least one of:
   (i) the concentration of the highly doped semiconductor regions in the second dimension;
   (ii) a charge concentration of the two dimensional carrier gas; and
   (iii) a thickness of the III-nitride semiconductor region in the first dimension.

15. The device according to claim 10, wherein the heterojunction device further comprises a second gate terminal, wherein the second heterojunction gate terminal of the heterojunction device is operatively connected with either (i) a ground or (ii) the first terminal of the unipolar power transistor.

16. The device according to claim 15, wherein a further at least one of the plurality of pGaN islands is operatively connected to the second heterojunction gate terminal.

17. The device according to claim 1, further comprising one or more highly doped semiconductor regions between at least two of the plurality of pGaN islands,
   wherein the one or more highly doped semiconductor regions have the same conductivity type as the plurality of pGaN islands, and
   wherein the one or more highly doped semiconductor regions length in the second dimension is less than a length of the plurality of pGaN islands in the second dimension, and
   wherein at least one of the plurality pGaN islands is operatively connected to the heterojunction gate terminal.

18. The device according to claim 1 wherein a gate driver for driving said unipolar power transistor and said heterojunction device is operatively connected to an external control terminal.

19. The device according to claim 18, wherein the external control terminal is either:
   the second interface terminal; or
   a terminal of a slew rate control unit.

20. A device comprising:
   a heterojunction device comprising a first heterojunction terminal, a second heterojunction terminal and a heterojunction gate terminal operatively connected to an active gate region;
   a unipolar power transistor operatively connected in series with said heterojunction device;
   an interface unit comprising a first interface terminal and a second interface terminal, wherein a first interface terminal is operatively connected to the heterojunction gate terminal, and
   wherein a threshold voltage of said heterojunction device is less than a threshold voltage of said unipolar power transistor and is less than a blocking voltage of said unipolar power transistor,
   wherein said heterojunction device is a III-nitride semiconductor based heterojunction device, and wherein said active gate region of the heterojunction device comprises a p-type gallium nitride (pGaN) material,
   wherein the active gate region of the heterojunction device comprises a plurality of pGaN islands separated in a third dimension, wherein the threshold voltage of the heterojunction device is related to a size of a separation between adjacent pGaN islands, and wherein the third dimension is perpendicular to the second dimension, and
   wherein the heterojunction device and the unipolar power transistor are operable using a single control signal during switching of the device.

* * * * *